(12) United States Patent
Inagaki

(10) Patent No.: US 6,799,589 B2
(45) Date of Patent: Oct. 5, 2004

(54) METHOD AND APPARATUS FOR WET-CLEANING SUBSTRATE

(75) Inventor: Yasuhito Inagaki, Kanagawa (JP)

(73) Assignee: Sony Corporation (JP)

( * ) Notice: Subject to any disclaimer, the term of this patent is extended or adjusted under 35 U.S.C. 154(b) by 195 days.

(21) Appl. No.: 09/985,396

(22) Filed: Nov. 2, 2001

(65) Prior Publication Data
US 2002/0059943 A1 May 23, 2002

(30) Foreign Application Priority Data

| Nov. 8, 2000 | (JP) | P 2000-341092 |
|---|---|---|
| Nov. 8, 2000 | (JP) | P 2000-341093 |
| Nov. 8, 2000 | (JP) | P 2000-341094 |
| Nov. 29, 2000 | (JP) | P 2000-363155 |
| Dec. 5, 2000 | (JP) | P 2000-369632 |

(51) Int. Cl.$^7$ ............................................. B08B 3/00
(52) U.S. Cl. ................... 134/84; 134/61; 134/94.1; 134/100.1; 134/902
(58) Field of Search ................. 134/61, 84, 94.1, 134/100.1, 56 R, 902; 436/43, 50, 55, 100, 101, 113, 124, 125; 700/266, 267, 260–274; 702/22–32

(56) References Cited

U.S. PATENT DOCUMENTS 5,472,516 A * 12/1995 Hanson et al. ................. 134/18
5,976,988 A 11/1999 Konuma et al.
6,092,539 A 7/2000 Chang et al.
6,261,845 B1 * 7/2001 Verhaverbeke et al. ....... 436/55

FOREIGN PATENT DOCUMENTS

| DE | 198 40 989 | 3/1999 |
|---|---|---|
| JP | 56000214 | 1/1981 |
| JP | 8-334461 | * 12/1996 |
| JP | 9022891 | 1/1997 |
| WO | 98/56726 | 12/1998 |
| WO | 01/39262 | 5/2001 |

OTHER PUBLICATIONS

Kashkoush et al: In–Situ Chemical Concentration Control for Wafer Wet Cleaning, Journal of the IEST, Mont Prospect, IL, US vol. 41, No. 3 May 1998, pp. 24–30 XP000957413.

* cited by examiner

Primary Examiner—M. Kornakov
(74) Attorney, Agent, or Firm—Rader, Fishman & Grauer PLLC; Ronald P. Kananen

(57) ABSTRACT

In the art of wet-cleaning a substrate by etching with a cleaning solution prepared by dissolving hydrofluoric acid as an active component in water, using the process of measuring the concentration of a predetermined component regularly and then replenishing the cleaning solution with a component for correcting the concentration at need on the basis of the result of measurement on the concentration in case of cleaning the substrate with an aqueous solution of ammonium fluoride as the cleaning solution while controlling air in a cleaning draft at an exhaust rate within a predetermined range.

2 Claims, 25 Drawing Sheets

F I G. 11
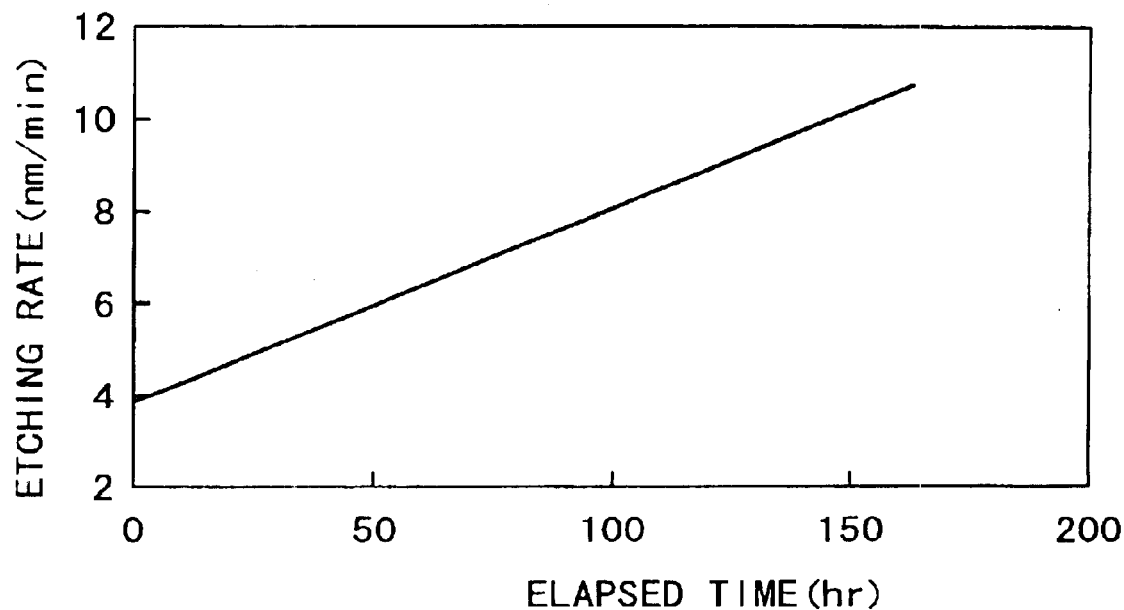
F I G. 12
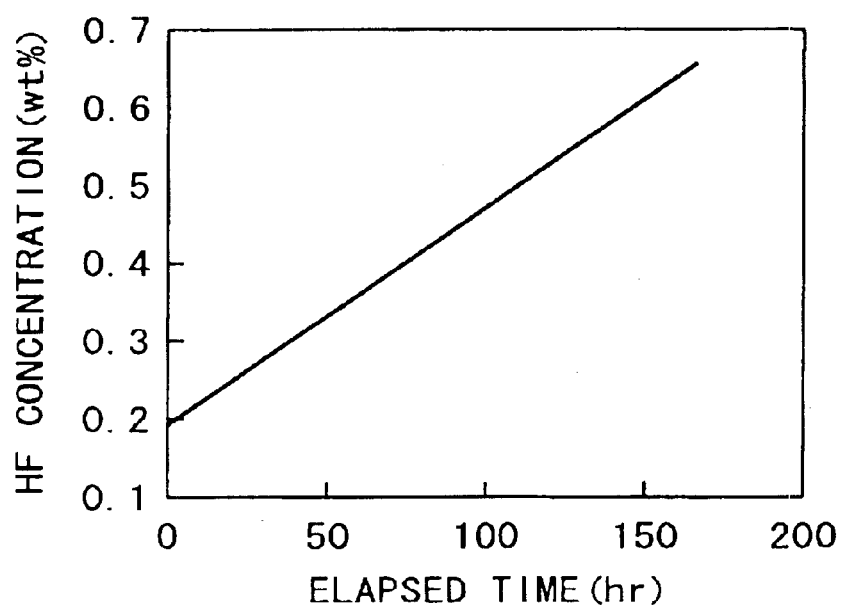

METHOD AND APPARATUS FOR WET-CLEANING SUBSTRATE

CROSS REFERENCE TO RELATED APPLICATION

This application claims priority to Japanese Patent Application No. JP 2000-341094, JP 2000-341093, JP 2000-341092, JP 2000-363155, JP 2000-369632, and the disclosure of these applications are incorporated herein by reference to the extent permitted by law.

BACKGROUND OF THE INVENTION

1. Field of the Invention

This invention relates to a method and apparatus for cleaning a substrate with an aqueous solution of ammonium fluoride as a cleaning solution, and more specifically, to a novel substrate cleaning method and apparatus developed with objectives of providing a uniform and stable cleaning process with less amount of cleaning solution consumed.

2. Description of the Related Arts

Aqueous solutions of ammonium fluoride hydrofluoric acid mixture and ammonium fluoride or hydrofluoric acid are used as a cleaning solution for cleaning a semiconductor substrate, a glass substrate in the process of manufacturing a semiconductor and a LCD (Liquid Crystal Display). The semiconductor substrate is cleaned mainly for the purpose of removing an oxide layer (a thermal oxide layer or a native oxide layer) from the substrate surface by etching, while the glass substrate is cleaned for the purpose of removing a surface layer from the glass substrate similarly by etching. Incidentally, the above aqueous solution of ammonium fluoride is a desired hydrofluoric acid ammonium mixture solution, which is dissolved in the form of $NH_4F$ in water and sometimes contains a surfactant.

In the technical field of manufacture of the semiconductor and the LCD, the art capable of finer processing is required for higher integration to provide more lightweight, smaller-sized, less power consumption products. In view of the above circumstances, there has been a need for a more accurate cleaning process in the substrate cleaning art using the above cleaning solution as well.

Incidentally, wet-cleaning of the semiconductor substrate in the related art is generally by the process of storing a cleaning solution in a cleaning bath provided in a cleaning draft, loading a number of semiconductor substrates in a container called a wafer cassette, and then immersing the substrates inclusively of the cassette in the cleaning solution for cleaning, while allowing clean air to flow through the cleaning draft without the need for special control.

In this related art, the HF (hydrofluoric acid) concentration in the cleaning solution increases with the lapse of cleaning time as shown in FIG. 1. Incidentally, FIG. 1 is a graphical representation of the relation between the elapsed time (cleaning time) since it started to use the cleaning solution for the cleaning process and the HF concentration of the cleaning solution. In consequence, the cleaning process in the above related art is of no effect on uniform and stable cleaning by reason of the considerably non-uniform change in concentration rise as well as the increase in etching rate of the silicon oxide or the glass substrate surface layer with the lapse of time as shown in FIG. 2, resulting in problems inclusive of difficulty in providing higher yield of the semiconductor substrate and the liquid crystal display substrate.

The rise of HF concentration of the cleaning solution with the lapse of cleaning time may occur due to the following causes. That is, one of the causes is that a water content exhaled from the cleaning solution is discharged to the outside of the cleaning draft together with clean air. Another cause is that ammonium hydroxide and hydrofluoric acid are dissociating from ammonium fluoride ($NH_4F$) in the aqueous solution of ammonium fluoride so that ammonium hydroxide is discharged in the form of ammonium gas to the outside of the cleaning draft similarly together with the clean air.

For that reason, the rise of active component concentration of the cleaning solution (inclusively of non-uniform concentration) has been controlled by means of frequent replacement of the cleaning solution in the related art. However, a considerably large amount of cleaning solution is required for performing the above measure. In particular, since the ammonium fluoride cleaning solution is used at the concentration as high as about 40 wt. %, there is a need for a larger amount of chemicals consumed per cycle of solution replacement, as compared with other cleaning solutions normally used at the concentration of about several wt. %.

A waste fluid treatment (a waste water treatment) according to a process as shown in FIG. 3 is also required for the used hydrofluoric acid cleaning solution (a hydrofluoric acid cleaning solution 5). However, the waste fluid treatment in this case brings about not only the need for a large amount of resources consumed, that is, waste water treatment agents but also the increase in released waste (waste water and sludge) amount with the increasing amount of resources consumed, as is apparent from a material balance view of FIG. 4. Incidentally, FIG. 3 is a flow sheet (a flow of the treatment for an ammonium fluoride waste fluid released from the semiconductor manufacture process) showing the process of the waste fluid treatment for the used cleaning solution. FIG. 4 is a view illustrating a material balance relating to the process of the waste fluid treatment in FIG. 3.

Incidentally, the global environmental issues have been recently made as a matter of worldwide concerns, and influences of the semiconductor or LCD substrate manufacture process on the environment have been at issue. In these days, there has been socially a long-felt need for measures not only to decrease the cleaning cost in the substrate manufacture process but also to meet the preservation of the environment inclusive of the resource saving, the decrease in released waste amount and the environmental purification.

For that reason, an apparatus having a cleaning bath installed under the atmosphere subjected to temperature, humidity and clean air flow or like control has been proposed as a cleaning apparatus structured to permit the chemical composition of a cleaning solution in the cleaning bath to be maintained at a value within a predetermined range without the need for frequent replacement of the cleaning solution (See Japanese Patent Laid-open No. 9-22891). However, this cleaning apparatus, although uses a humidified air curtain, has difficulty in maintaining the cleanliness of substrates to be cleaned by reason of the horizontal flow of clean air, and besides, needs to discontinue the flow of air every operation of taking in and out the substrates to be cleaned, resulting in problems inclusive of the need for troublesome operations.

As described above, the substrate wet-cleaning process in the related art is also of no effect on uniform and stable cleaning by reason of the considerably non-uniform change in concentration rise as well as the increase in etching rate of the silicon oxide layer (or the glass substrate surface) with the lapse of cleaning time (that is, with the elapsed time since it started to use the cleaning solution for the cleaning process), resulting in problems inclusive of difficulty in providing higher yield of the semiconductor substrate and the liquid crystal display substrate.

As the result of measurement conducted by the present inventor as to the HF (hydrofluoric acid) concentration of the above cleaning solution, it was ascertained that the HF concentration of the cleaning solution increases with the lapse of cleaning time as shown in FIG. 6, and the etching rate of the silicon oxide increases with the increasing HF concentration of the cleaning solution on the basis of the results shown in FIGS. 5 and 6, as shown in FIG. 7. It was also ascertained that the cleaning apparatus having the cleaning bath installed in the cleaning draft allowing the clean air to flow therethrough for exhaust of air shows a particularly marked tendency toward the increase in etching rate.

The rise of HF concentration of the cleaning solution with the lapse of cleaning time occurs from the following causes. That is, one of the causes is that a water content is exhaled from the cleaning solution. Another cause is that ammonium hydroxide and hydrofluoric acid are dissociating from ammonium fluoride ($NH_4F$) in the aqueous solution of ammonium fluoride so that the ammonium hydroxide is exhaled in the form of ammonium gas.

For that reason, the rise of active component concentration of the cleaning solution (inclusively of the non-uniform concentration) has been controlled by means of frequent replacement of the cleaning solution. However, a considerably large amount of cleaning solution is required for the above means. In particular, since the ammonium fluoride cleaning solution is available at the concentration as high as about 40 wt. %, there is a need for a larger amount of ammonium fluoride and hydrofluoric acid consumed per cycle of solution replacement, as compared with other cleaning solutions normally available at the concentration of about several wt. %.

A waste fluid treatment (a waste water treatment) according to the process as shown in FIG. 3 is also required for the spent hydrofluoric acid cleaning solution (the hydrofluoric acid cleaning solution). However, the waste fluid treatment in this case brings about not only the need for a large amount of resources consumed, that is, waste water treatment agents but also the increase in released waste (waste water 35, 45 and sludge 36, 46) amount with the increasing amount of resources consumed, as is apparent from a material balance view of FIG. 8. Incidentally, FIG. 8 is a view illustrating a material balance relating to the process of the waste fluid treatment in FIG. 3.

In Japanese Patent laid-open JP No. 9-22891 (the invention titled "Apparatus and method for wet process"), there is disclosed a wet process apparatus having an effect on a uniform etching/cleaning process from the viewpoint of the lapse of time. This wet process apparatus has two tanks, that is, a chemical composition tank and a composition control tank, whereby composition control chemicals are supplied from the composition control tank to a chemical bath (an etching bath and a cleaning bath) arranged at a predetermined location to maintain the composition-changed chemicals in the chemical bath at the predetermined composition.

However, the composition control tank is merely suitable for storage of the composition control chemicals supplied to the chemical bath, and the composition control chemicals are merely available for composition control. The above disclosed apparatus is fundamentally different in these points from the substrate wet-cleaning method and apparatus according to the present invention as will be described later, and shows the operations and effects also quite different therefrom.

The process of cleaning or etching the substrate with the aqueous solution of ammonium fluoride or ammonium fluoride hydrofluoric acid mixture presents problems inclusive of the change (increase) in etching rate for the silicon oxide or the glass substrate by reason of the change (evaporation) in chemical components ($NH_4F$ and HF) or water content in the cleaning solution with the lapse of time.

The above problem is caused by the gradual increase in concentration of hydrofluoric acid component in the cleaning solution with the lapse of time in the process of being used. On the other hand, in the existing circumstances, frequent replacement of the cleaning solution has been applied as a measure to cope with the concentration change in various components in the cleaning solution.

However, a considerably large amount of cleaning solution is required for the above measure (In particular, since the ammonium fluoride cleaning solution is used at the concentration as high as several ten wt. % (about 40 wt. %, for instance), there is a need for a larger amount of chemicals consumed per cycle of solution replacement, as compared with other cleaning solutions normally available at the concentration of about several wt. %.), resulting in the increase in ammonium fluoride or hydrofluoric acid consumption (chemical cost) with the increasing amount of cleaning solution used.

The waste water treatment as shown in FIG. 3 is also required for the used cleaning solution. However, the waste water treatment in this case brings about not only the need for a large amount of resources (waste water treatment agents) consumed but also the increase in released waste (waste water and sludge) amount with the increasing amount of resources consumed (See FIG. 4).

FIG. 3 is a view illustrating the process of the waste fluid treatment for the used cleaning solution. As shown in FIG. 3, the waste fluid discharged from the cleaning bath 1 is carried to a pH control tank 2 for neutralization with a 20% calcium hydroxide solution. Subsequently, the neutralized waste fluid is carried to a coagulo-sedimentation tank 3 for coagulo-sedimentation with chemicals such as aluminum sulfate, and is further carried to a coagulation tank 4 for coagulation and precipitation with a polymeric coagulant such as a polyacrylic amide coagulant, and finally, the resultant is released as sewage and sludge.

In the above process of the waste fluid treatment as shown in FIG. 4, 2.0 Kg of 20% calcium hydroxide, 0.3 Kg of 8% aluminum sulfate and 1.6 Kg of polymeric coagulant are used for 1.0 Kg of an aqueous solution of 40% ammonium fluoride, and 2.6 Kg of 70% solid sludge and 2.3 Kg of waste water are released as wastes.

Incidentally, the global environmental issues have been recently made as a matter of worldwide concerns, and the environmental burden on the semiconductor or LCD substrate manufacture process has been at issue. In these days, there has been socially a long-felt need also on the cleaning solution for measures not only to decrease the cost but also to meet the preservation of the environment inclusive of the resource saving, the decrease in released waste amount and the environmental purification.

SUMMARY OF THE INVENTION

A first object of the present invention is to, in the substrate wet-cleaning art using a cleaning solution prepared by dissolving hydrofluoric acid as an active component in water, realize a decrease in environmental burden resulting from the use of the cleaning solution, inclusive of a decrease in cleaning chemical consumption, a decrease in released waste amount and a control of environmental pollution and so on, while permitting a cleaning process to be made uniform and stable.

A second object of the present invention is to, in a method and apparatus for cleaning a substrate through the process of successively immersing substrates to be cleaned in a plurality of cleaning baths including at least a cleaning bath stored with a cleaning solution containing an aqueous solution of ammonium fluoride and/or hydrofluoric acid, realize a decrease in environmental burden resulting from the use of the cleaning solution, inclusive of a decrease in cleaning chemical consumption, a decrease in released waste amount and a control of environmental pollution and so on, while permitting a cleaning process to be made uniform and stable by controlling the HF concentration rise occurring in the cleaning solution with the lapse of cleaning time.

A third object of the present invention is to provide a substrate cleaning method and a substrate cleaning apparatus, which have an effect of making a substrate cleaning process uniform and stable, and also permit a decrease in released waste amount and so on with the decreasing amount of resources consumed.

In a method for cleaning a substrate through the process of storing a cleaning solution prepared by dissolving active components in water in a cleaning bath provided in a cleaning draft, and then immersing substrates to be cleaned in the cleaning solution for cleaning while allowing clean air to flow into the cleaning draft, a method for wet-cleaning a substrate according to an embodiment of the present invention comprises the steps of cleaning the substrates to be cleaned, while supplying clean air humidified to control the relative humidity within a predetermined range toward the level of the cleaning solution in the cleaning bath downwards vertically, together with exhaust of air of the cleaning draft at an exhaust rate in a predetermined range.

According to the cleaning method described above, the clean air supplied is preferably limited in relative humidity to the range of 40 to 50% and also in temperature to a room temperature, providing more increased effects of the present invention. Atmospheric pressure in the cleaning draft is also preferably limited to a value slightly higher than that outside the cleaning draft for preventing the air outside the cleaning draft from entering the cleaning draft. With this, the cleanliness of clean air in the cleaning draft is maintained, and the flow-through state, temperature and humidity of the clean air are stabilized, permitting the continuous operation of more stable wet cleaning.

According to the cleaning method described above, a silicon oxide or a surface layer may be removed from a silicon substrate or a glass substrate efficiently by etching by use of the solution prepared by dissolving at least one of ammonium fluoride and hydrofluoric acid in water as the cleaning solution.

Also, in an apparatus for cleaning a substrate through the process of storing a cleaning solution prepared by dissolving active components in water in a cleaning bath provided in a cleaning draft, and then immersing substrates to be cleaned in the cleaning solution for cleaning while allowing clean air to flow into the cleaning draft, an apparatus for wet-cleaning a substrate according to an embodiment of the present invention comprises a clean air supplier for supplying the clean air into the cleaning draft toward the level of the cleaning solution in the cleaning bath downwards vertically, a humidifier for supplying steam or mist-like water drops into the cleaning draft to maintain the relative humidity of the clean air in the cleaning draft at a value within a predetermined range, a hygrometer placed in the neighborhood of the level of the cleaning solution in the cleaning bath and connected to the humidifier, an exhaust piping for allowing exhaust of air of the cleaning draft, and an exhaust rate controller provided on the exhaust piping, wherein an amount of steam or mist-like water drops supplied from the humidifier is controlled within a predetermined range by feed-back of a humidity value measured by the hygrometer to the humidifier, and air of the cleaning draft is exhausted at the rate within a predetermined range under controlling of the exhaust rate controller.

According to the wet-cleaning apparatus, preferably, the clean air supplier comprises a blower and a dust removal filter connected to the air discharge side of the blower, the humidifier for supplying the steam or mist-like water drops toward the level of the cleaning solution in the cleaning bath downwards vertically is used, and the exhaust rate controller may comprise a damper having an automatically adjustable opening and an airflow meter or a manometer provided on the exhaust piping, while these meters are connected to the damper to control the opening of the damper by feed-back of values measured by these meters to the damper.

Preferably, the wet-cleaning apparatus further comprises a unit provided as the humidifier for supplying steam or mist-like water drops of a temperature controlled within a predetermined range and an air conditioner for controlling the temperature of the clean air supplied toward the level of the cleaning solution downwards vertically within the predetermined range.

The substrate cleaning method and apparatus according to an embodiment of the present invention are realized on the basis of the fact discovered by the present inventor that the rise of HF concentration with the lapse of time is corrected with a cleaning solution supplied from another cleaning bath or from a cleaning bath in a different cleaning process, thereby providing a uniform and stable substrate cleaning process (a uniform and stable etching rate). According to the present inventor, it was also ascertained that using the above method for cleaning the substrate permits the decrease in frequency in replacement of the cleaning solution, the decrease in cleaning chemical consumption and the decrease in released waste amount with the decreasing amount of chemicals consumed for the waste fluid treatment and so on.

That is, in a method for cleaning a substrate through the process of successively immersing substrates to be cleaned in a plurality of cleaning baths including at least a cleaning bath stored with a cleaning solution containing an aqueous solution of ammonium fluoride and/or hydrofluoric acid, a method for wet-cleaning a substrate according to an embodiment of the present invention comprises the steps of supplying a cleaning solution from another cleaning bath to the cleaning bath stored with the ammonium fluoride and/or hydrofluoric acid cleaning solution to correct the rise of HF concentration of the cleaning solution in the above cleaning bath stored with the ammonium fluoride and/or hydrofluoric acid cleaning solution.

The method for wet-cleaning a substrate according to the present embodiment is also characterized in that another cleaning bath described above is a bath stored with an aqueous solution of ammonium with no content of fluoride. Another cleaning bath described above may be also a bath stored with pure water or a bath stored with alcohol. More preferably, the alcohol used may be isopropyl alcohol.

Also, in a method for cleaning a substrate through the process of successively immersing substrates to be cleaned in a plurality of cleaning baths including at least a cleaning bath stored with a cleaning solution containing an aqueous solution of ammonium fluoride and/or hydrofluoric acid, a method for wet-cleaning a substrate according to an embodiment of the present invention comprises the steps of supplying a cleaning solution from a cleaning bath in a different cleaning process to the cleaning bath stored with the ammonium fluoride and/or hydrofluoric acid cleaning solution to correct the rise of HF concentration of the cleaning solution in the above cleaning bath stored with the ammonium fluoride and/or hydrofluoric acid cleaning solution.

The method for wet-cleaning a substrate according to the present embodiment is also characterized in that the cleaning bath in the different cleaning process is a bath stored with an aqueous solution of ammonium with no content of fluoride. The cleaning bath in the different cleaning process may also be a bath stored with pure water or a bath stored with alcohol. More preferably, the alcohol used may be isopropyl alcohol.

Also, an apparatus for wet-cleaning a substrate according to the second object of the present invention comprises a plurality of cleaning baths including at least a cleaning bath stored with a cleaning solution containing an aqueous solution of ammonium fluoride and/or hydrofluoric acid, and piping provided between the cleaning bath stored with the ammonium fluoride and/or hydrofluoric acid cleaning solution and another cleaning bath stored with a solution for correcting the rise of HF concentration of the cleaning solution in the cleaning bath stored with the ammonium fluoride and/or hydrofluoric acid cleaning solution, wherein another cleaning bath is a cleaning bath in the same cleaning process.

Also, an apparatus for wet-cleaning a substrate according to an embodiment of the present invention comprises a plurality of cleaning baths including at least a cleaning bath stored with a cleaning solution containing an aqueous solution of ammonium fluoride and/or hydrofluoric acid, and piping provided between the cleaning bath stored with the ammonium fluoride and/or hydrofluoric acid cleaning solution and another cleaning bath stored with a solution for correcting the rise of HF concentration of the cleaning solution in the cleaning bath stored with the ammonium fluoride and/or hydrofluoric acid cleaning solution, wherein another cleaning bath is a cleaning bath in a different cleaning process.

As described above, the method and apparatus for wet-cleaning the substrate according to the present embodiment are characterized in that the rise of HF concentration of the cleaning solution in the cleaning bath for cleaning the substrate after being immersed in the cleaning solution is corrected by means of diluting the cleaning solution with (1) the cleaning solution supplied from another cleaning bath installed together with the cleaning bath to constitute a series of cleaning processes or (2) the cleaning solution supplied from a cleaning bath constituting a cleaning process different from the above series of cleaning processes. That is, although either of the cleaning solution in each of the plurality of cleaning baths constituting the series of cleaning processes or the cleaning solution in the cleaning bath constituting the different cleaning process is treated as wastes in the process of the waste water treatment whenever a predetermined period of cleaning time has elapsed, the method and apparatus of the present embodiment permit the effective utilization of the above cleaning solutions as diluent, thus providing a uniform and stable substrate cleaning process.

A method and apparatus according to an embodiment of the present invention are provided in view of the presence of problems with a cleaning or etching process, inclusive of the change (increase) in etching rate for the silicon oxide or glass substrate by reason of the change (evaporation) in chemical components ($NH_4F$, HF) or water content in the cleaning solution with the lapse of time.

The above problem is caused by the gradual increase in concentration of hydrofluoric acid component in the cleaning solution with the lapse of time in the process of being used. On the other hand, in the existing circumstances, frequent replacement of the cleaning solution has been applied as a measure to cope with the change in concentration of various components in the cleaning solution.

However, a considerably large amount of cleaning solution is required for the above measure. In particular, since the ammonium fluoride cleaning solution is available at the concentration as high as several ten wt. % (about 40 wt. %, for instance). Accordingly, there is a need for a larger amount of chemicals consumed per cycle of solution replacement, as compared with other cleaning solutions normally used at the concentration of about several wt. %., resulting in the increase in ammonium fluoride or hydrofluoric acid consumption (cost for chemical products) with the increasing amount of cleaning solution used.

The waste water treatment as shown in FIG. 3 is also required for the used cleaning solution. The waste water treatment in this case brings about not only the need for a large amount of resources (waste water treatment agents) consumed but also the increase in released waste (waste water and sludge) amount with the increasing amount of resources consumed (See FIG. 8).

FIG. 3 is a view illustrating the process of the waste fluid treatment for the cleaning solution. As shown in FIG. 3, the waste fluid discharged from the cleaning bath 1 is carried to a pH control tank 2 for neutralization with a 20% calcium hydroxide solution, for instance. Subsequently, the neutralized waste fluid is carried to a coagulo-sedimentation tank 3 for coagulo-sedimentation with chemicals such as aluminum sulfate, and is then carried to a coagulation tank 4 for coagulation and precipitation with a polymeric coagulant such as a polyacrylic amide coagulant, and finally, the resultant is released as sewage and sludge.

In the process of the waste fluid treatment as shown in FIG. 8, 2.0 Kg of 20% calcium hydroxide, 0.3 Kg of 8% aluminum sulfate and 1.6 Kg of polymeric coagulant are used for 1.0 Kg of an aqueous solution of 40% ammonium fluoride, and 2.6 Kg of 70% solid sludge and 2.3 Kg of waste water are released as wastes.

The present embodiment is also provided in view of the above circumstances, and there is provided a substrate cleaning method and a substrate cleaning apparatus, which have an effect of making a cleaning process uniform and stable and also permit the decrease in released waste amount and so on with the decreasing amount of resources consumed.

In a method for cleaning a substrate with an aqueous solution of ammonium fluoride at the ammonium fluoride (wt. %)-to-hydrogen fluoride (wt. %) ratio of more than 50 (>50) as a cleaning solution, a method for cleaning a substrate according to an embodiment of the present invention comprises the step of replenishing the cleaning solution with an ammonium component with the lapse of time the cleaning solution was used.

In an apparatus for cleaning a substrate with an aqueous solution of ammonium fluoride at the ammonium fluoride (wt. %)-to-hydrogen fluoride (wt. %) ratio of more than 50 (>50) as a cleaning solution, an apparatus for cleaning a substrate according to an embodiment of the present invention comprises a substrate cleaning bath stored with the cleaning solution and a replenishing means for replenishing the cleaning solution in the substrate cleaning bath with an ammonium component.

When the aqueous solution of ammonium fluoride or ammonium fluoride hydrogen fluoride mixture is used as the cleaning solution for cleaning or etching the substrates, the concentration and composition of the cleaning solution change with the lapse of time.

According to the experiment conducted by the present inventor, it is found that the state of the change in concentration and composition varies depending on the ammonium fluoride-to-hydrogen fluoride ratio when the aqueous solution of ammonium fluoride hydrogen fluoride mixture is used as the cleaning solution.

When the composition ratio of ammonium fluoride (wt. %) to hydrogen fluoride (wt. %) is more than 50 (>50), for instance, the change in ammonium fluoride-to-hydrogen fluoride ratio occurs (lowers) with the lapse of time. As a result, the hydrogen fluoride rate in the cleaning solution is increased.

On the other hand, when the composition ratio of ammonium fluoride (wt. %) to hydrogen fluoride (wt. %) is not more than 50 ($\leq$50), for instance, the change in ammonium fluoride-to-hydrogen fluoride ratio hardly occurs.

In other words, when the aqueous solution having the ammonium fluoride (wt. %)-to-hydrogen fluoride (wt. %) ratio of not more than 50 ($\leq$50) is used as the cleaning solution for cleaning the substrates, the process of replenishing the above cleaning solution with water is required with the lapse of time while the cleaning solution is being used.

On the other hand, when the aqueous solution having the ammonium fluoride (wt. %)-to-hydrogen fluoride (wt. %) ratio of more than 50 (>50) is used as the cleaning solution for cleaning the substrates, the process of replenishing the above cleaning solution with an ammonium component is required with the lapse of time while the cleaning solution is being used.

As described above, when the composition ratio of ammonium fluoride (wt. %) to hydrogen fluoride (wt. %) is more than 50 (>50), the gradual change in ammonium fluoride-to-hydrogen fluoride ratio occurs with the lapse of time. However, excessive hydrogen fluoride is converted into ammonium fluoride by means of replenishing the cleaning solution with the ammonium component, and as a result, the HF concentration is maintained constant.

With the above process, the amount of cleaning solution consumed is decreased with the decreasing frequency in replacement of the cleaning solution, permitting the decrease in amount of waste water and sludge released from the waste water treatment with the decreasing amount of chemicals for the waste water treatment for the cleaning solution.

That is, according to the present embodiment, the substrate cleaning process is made uniform and stable, and besides, the amount of wastes released is decreased with the decreasing amount of cleaning solution consumed.

Also, in an apparatus for cleaning a substrate with an aqueous solution of ammonium fluoride and hydrogen fluoride at the ammonium fluoride (wt. %)-to-hydrogen fluoride (wt. %) ratio of not more than 50 ($\leq$50), an apparatus for cleaning a substrate according to an embodiment of the present invention comprises a substrate cleaning bath stored with the cleaning solution and a replenishing means for replenishing the cleaning solution in the substrate cleaning bath with water.

When the aqueous solution of ammonium fluoride hydrogen fluoride mixture is used as the cleaning solution for cleaning or etching the substrates, the concentration and composition of the cleaning solution change with the lapse of time.

According to the experiment conducted by the present inventor, it is found that the state of the change in concentration and composition varies depending on the ammonium fluoride-to-hydrogen fluoride ratio when the aqueous solution of ammonium fluoride hydrogen fluoride mixture is used as the cleaning solution.

When the composition ratio of ammonium fluoride (wt. %) to hydrogen fluoride (wt. %) is not more than 50 (23 50), for instance, the change in ammonium fluoride-to-hydrogen fluoride ratio hardly occurs.

In this connection, according to the present embodiment, when the aqueous solution having the ammonium fluoride (wt. %)-to-hydrogen fluoride (wt. %) ratio of not more than 50 ($\leq$50) is used as the cleaning solution for cleaning the substrates, the process of replenishing the cleaning solution with water is required with the lapse of time while the cleaning solution is being used.

Since the change in ammonium fluoride to hydrogen fluoride ratio hardly occurs when the composition ratio of ammonium fluoride (wt. %) to hydrogen fluoride (wt. %) is not more than 50 ($\leq$50) as described above, replenishment of the cleaning solution with water will be only enough to maintain the concentration constant.

With this, the amount of cleaning solution consumed is decreased with the decreasing frequency in replacement of the cleaning solution, permitting the decrease in amount of waste water and sludge released from the waste water treatment with the decreasing amount of chemicals for the waste water treatment for the cleaning solution.

That is, according to the present embodiment of the present invention, the substrate cleaning process is made uniform and stable, and besides, the amount of wastes released is decreased with the decreasing amount of cleaning solution consumed.

BRIEF DESCRIPTION OF THE DRAWINGS

The foregoing and other objects and features of the invention will become apparent from the following description of preferred embodiments of the invention with reference to the accompanying drawings, in which;

FIG. 11 is a characteristic graphical representation of the relation in a cleaning solution between the elapsed time and the etching rate;

FIG. 12 is a characteristic graphical representation of the relation between the elapsed time and the HF concentration of the cleaning solution;

DETAILED DESCRIPTION OF THE PREFERRED EMBODIMENTS

Figure 9:
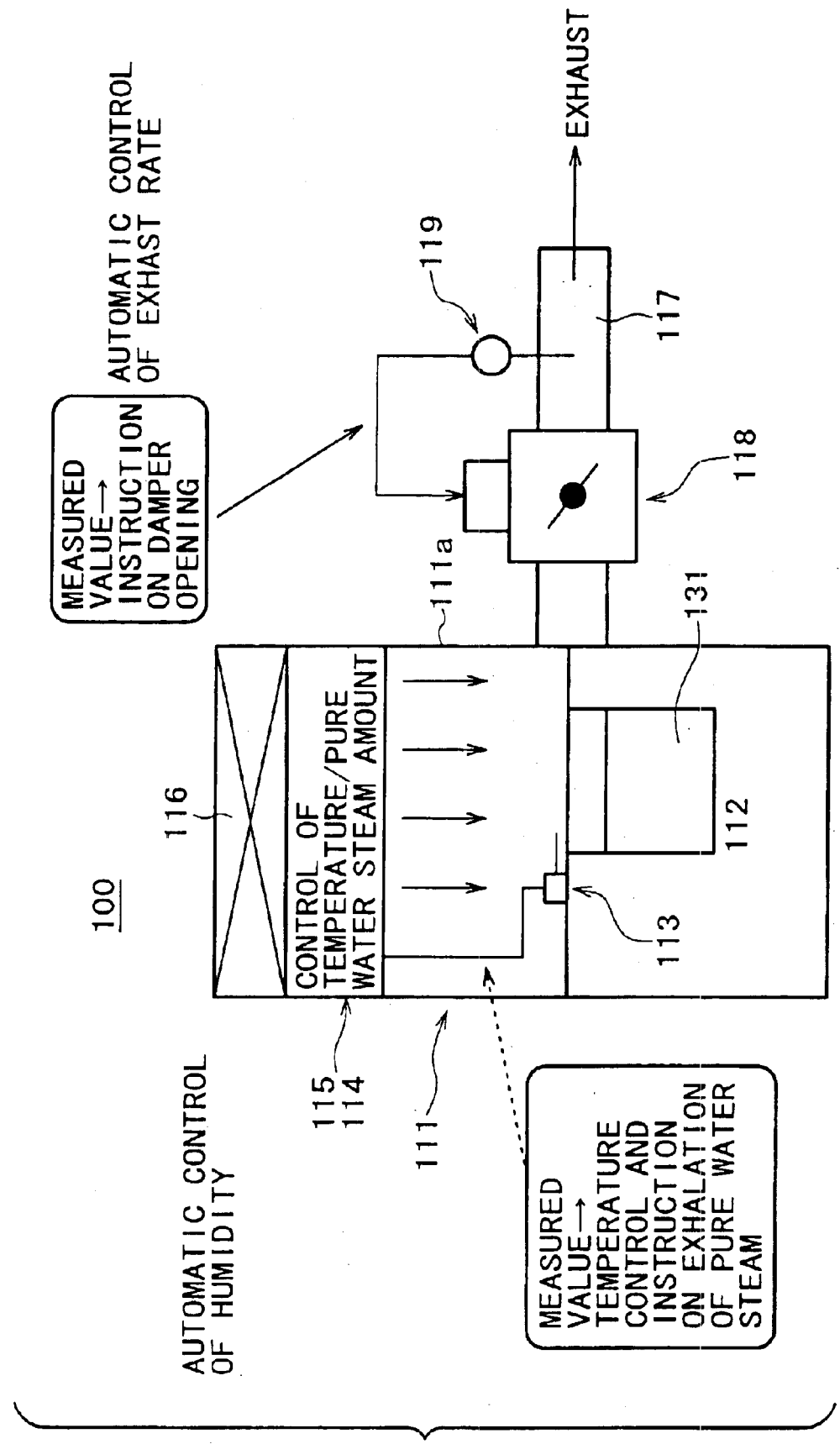
FIG. 9 is a schematic illustration of a structure of a wet-cleaning apparatus according to an embodiment of the present invention, together with a substrate cleaning method carried into operation using this wet-cleaning apparatus.
Figure 10:
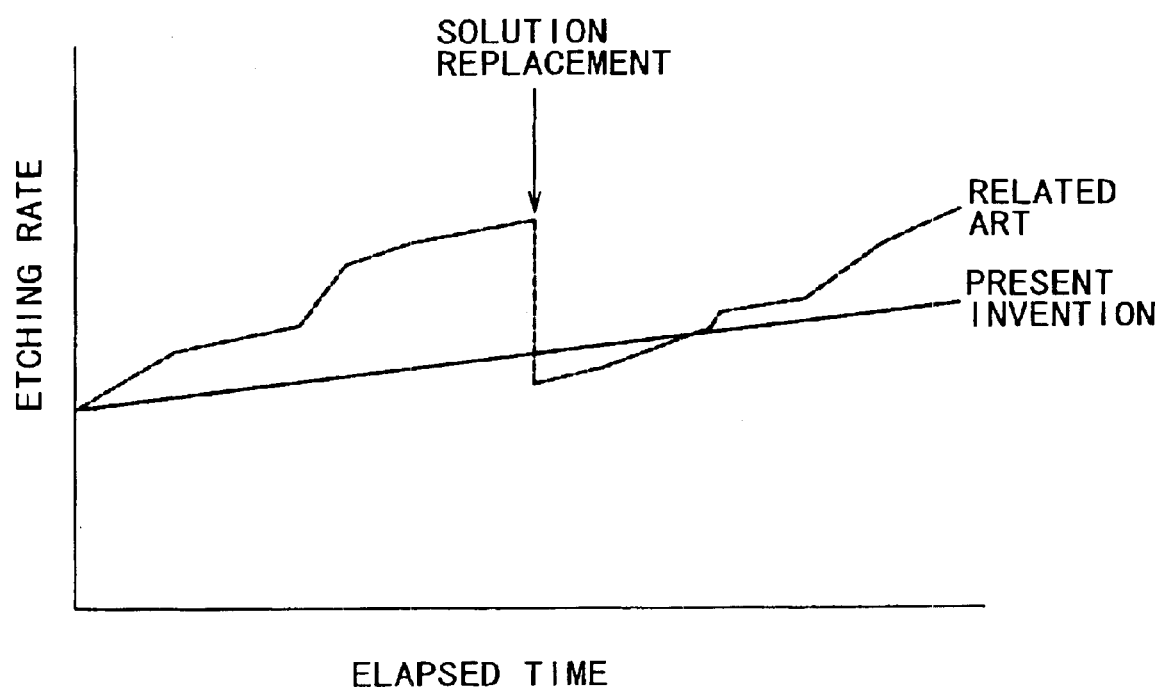
FIG. 10 is a graphical representation of the etching rate of a silicon oxide on the surface of a semiconductor substrate when the cleaning method of the present invention is used, in comparison with that when the cleaning method in the related art is used.

FIG. 9 is a schematic illustration of an apparatus for cleansing substrate (a wet-cleaning apparatus), together with a substrate cleaning method carried into operation using this wet-cleaning apparatus. FIG. 10 is a graphical representation of the etching rate of a silicon oxide on the surface of a semiconductor substrate when a cleaning method of the present invention is used, in comparison with that when the cleaning method in the related art is used.

A substrate cleaning apparatus 100 has the following structure. A cleaning bath 112 is provided at a lower part of a cleaning draft (a draft chamber) 111 having a pivotal door (not shown), and a hygrometer (or any type of detector measuring humidity) 113 is installed in the vicinity (of the surface level of a cleaning solution 131) of an upper end of the cleaning bath 112. A humidifier 114 and an air conditioner 115 are provided right above the cleaning bath 112, and a dust removal filter 115 is connected to the air inflow side of the air conditioner 115, while the hygrometer 113 is connected to the humidifier 114. The air inflow side of the dust removal filter 116 is connected to the air discharge side of a blower through an air supply duct, although not shown. A temperature control means (not shown) for controlling the solution temperature rise occurring with the lapse of cleaning time to maintain a cleaning solution at a room temperature is preferably provided in the cleaning bath 112.

An exhaust duct 117 is connected to a portion of a peripheral wall 111a of the cleaning draft 111 as being close to the upper end of the cleaning bath 112. The exhaust duct 117 has an automatic damper 118 and an airflow meter 119 (or a manometer) at the downstream side of the automatic damper. The airflow meter 119 may be either at the upstream side of the automatic damper 118 or in the cleaning draft 111.

Although only the cleaning bath 112 (an etching bath) is shown in the cleaning draft 111 in FIG. 9, a rinsing bath and a drying bath (not shown) may be also disposed at locations adjacent to the cleaning bath in the cleaning draft 111. In this case, the rinsing bath which may be for immersing the substrate in ion-exchange water, for instance, is used, and the drying bath which may be for drying the substrate by blowing clean air there against after spraying the substrate surface with IPA (isopropyl-alcohol), for instance, is used. Incidentally, the cleaning draft 111, the rinsing bath and the drying bath, which are installed in this order individually in partition chambers partitioned with walls in such a way that the adjacent partition chambers are allowed to communicate with each other by opening pivotal doors provided in the walls, will be also enough.

A description will now be given of a method for cleaning a silicon substrate using the substrate cleaning apparatus 100. A predetermined amount of room-temperature cleaning solution 131 prepared by dissolving ammonium fluoride and hydrofluoric acid in water to meet predetermined concentrations is supplied into the cleaning bath 112. After the automatic damper 118 is opened at an appropriate opening, power to the humidifier 114 and the air conditioner 115 is turned ON. Since the cleaning draft 111 needs to have the ambient with a relative humidity in which further evaporation of water may be prevented so as to control the evaporation loss of water from the cleaning solution 131, an objective value (preferably, a value close to saturation humidity) of the relative humidity is set by the humidifier 114. An objective value of the temperature is also set by the air conditioner 115 for limiting the atmosphere in the cleaning draft 111 to a predetermined temperature. An objective value of the exhaust rate is also set with respect to a drive mechanism of the automatic damper 118 for controlling the exhaust rate of air (per unit time) in the cleaning draft 111.

A number of silicon substrates (silicon wafers) are loaded in a wafer cassette in such a way that the substrates are placed vertically in parallel to each other with proper spaces in between. Then, the silicon substrates inclusive of the wafer cassette are immersed in the cleaning solution 131 to start the cleaning process. The silicon substrates in this cleaning process are cleaned in such a way that a native oxide layer is removed from the surface of each silicon substrate by this etching process.

In the cleaning process, air (limited in temperature to approximately a room temperature and in pressure to a value higher than the atmospheric pressure) is supplied from the blower to the substantially whole area of the surface level of the cleaning solution 131 in the cleaning bath 112 downwards vertically through the dust removal filter 116, the air conditioner 115 and the humidifier 114. In this case, the air from the blower is cleaned to a high degree with the dust removal filter 116, and the temperature of air is controlled within a predetermined range (normally, at substantially a room temperature) with the air conditioner 115. The relative humidity of air is also controlled within a predetermined range with mist-like pure water drops sprayed from the humidifier 114. Clean air subjected to contact with the level of the cleaning solution is exhausted to the outside through the automatic damper 118 at a predetermined flow rate.

According to the cleaning process as described above, the humidified clean air limited in pressure to a value higher than the atmospheric pressure and in temperature and humidity to predetermined values is supplied toward the substantial whole level of the cleaning solution 131 in the cleaning bath 112 downwards vertically. Thus, as compared with the process of allowing the clean air to flow in parallel to the level of the cleaning solution, the above cleaning process enhances substantially a function of controlling the evaporation loss of water from the cleaning solution, and also provides a higher function of air displacement at the level of the cleaning solution. In addition, the above cleaning process offers the advantages of more efficient displacement of air in spaces between the wafers with clean air when handling the wafer cassette loaded with the silicon wafers.

According to the above cleaning process, since the atmospheric pressure in the cleaning draft 111 is limited to a value slightly higher than the atmospheric pressure outside the cleaning draft, air outside the cleaning draft 111 may be prevented from entering the cleaning draft 111. With this arrangement, the above cleaning process eliminates the defects inclusive of the pollution of clean air in the cleaning draft due to the outside air entering the cleaning draft as well as the variations in flow-through state, temperature and humidity of the clean air in the cleaning draft, permitting the continuous operation of more stable wet-cleaning.

In an example of the present embodiment in accordance with the present invention, the cleaning apparatus shown in FIG. 9 is used to clean the silicon wafers according to the above cleaning method. On the other hand, in a comparative example, the silicon wafers were cleaned similarly to the example, except that the cleaning apparatus 100 of FIG. 9 was used without operating the air conditioner 115 and the humidifier 114 and the opening of the automatic damper 118 was held constant. The results are shown in FIG. 10.

According to the result of the example, the rise of etching rate with the elapsed time since the cleaning process is occurred slowly, and besides, the substantially constant rise of etching rate is observed as shown in FIG. 10. For that reason, there was no need for solution replacement, regardless of the long-term use of the same cleaning solution.

On the other hand, according to the result of the comparative example, the rise of etching rate to the elapsed time since the cleaning process is started occurred at a rate higher than that in the example, and besides, the non-uniform change in etching rate rise is observed. Thus, the solution was replaced in the course of the cleaning process. However, cleaning in a short period of time after the replacement of cleaning solution caused the rise of etching rate, and the etching rate became soon higher than that using the method according to the example requiring no replacement of cleaning solution.

The humidifier which utilizes ultrasonic waves may be used for the cleaning apparatus of FIG. 9, or supply of steam from boiling water into the cleaning draft for humidifying is also applicable. An operation of supplying the clean air limited in temperature and humidity as described above at a predetermined flow rate may be also effectively applied to the case of replenishing the cleaning solution with various components inclusive of ammonium fluoride, hydrofluoric acid, aqueous ammonium, water and a surfactant.

Measurement on the concentration of active components and water in the cleaning solution may be performed by employing methods for measuring (1) the absorbance of light with a predetermined wavelength, (2) infrared/ultraviolet absorption spectrum, and (3) refractive index, specific gravity, light transmittance and conductivity or the like, or using a measuring unit such as (4) a Karl Fischer's titration meter and (5) a liquid (ion) chromatography or the like.

Using the above cleaning method may lower substantially the change or non-uniformity in etching rate, that is, cleaning effects with the lapse of cleaning time as to the cleaning solution prepared by dissolving at least hydrofluoric acid as an active component in water, as shown in FIG. 10. Accordingly, the cleaning process with the above cleaning solution may be made uniform and stable, permitting the substantial decrease in amount of chemicals for the waste fluid treatment (the waste water treatment) for the above cleaning solution with the decreasing frequency in solution replacement (the extended life of the cleaning solution). The above cleaning method also has an effect of decreasing the amount of wastes released, that is, sludge and waste water (sewage) with the decreasing amount of chemicals consumed.

Figure 1:
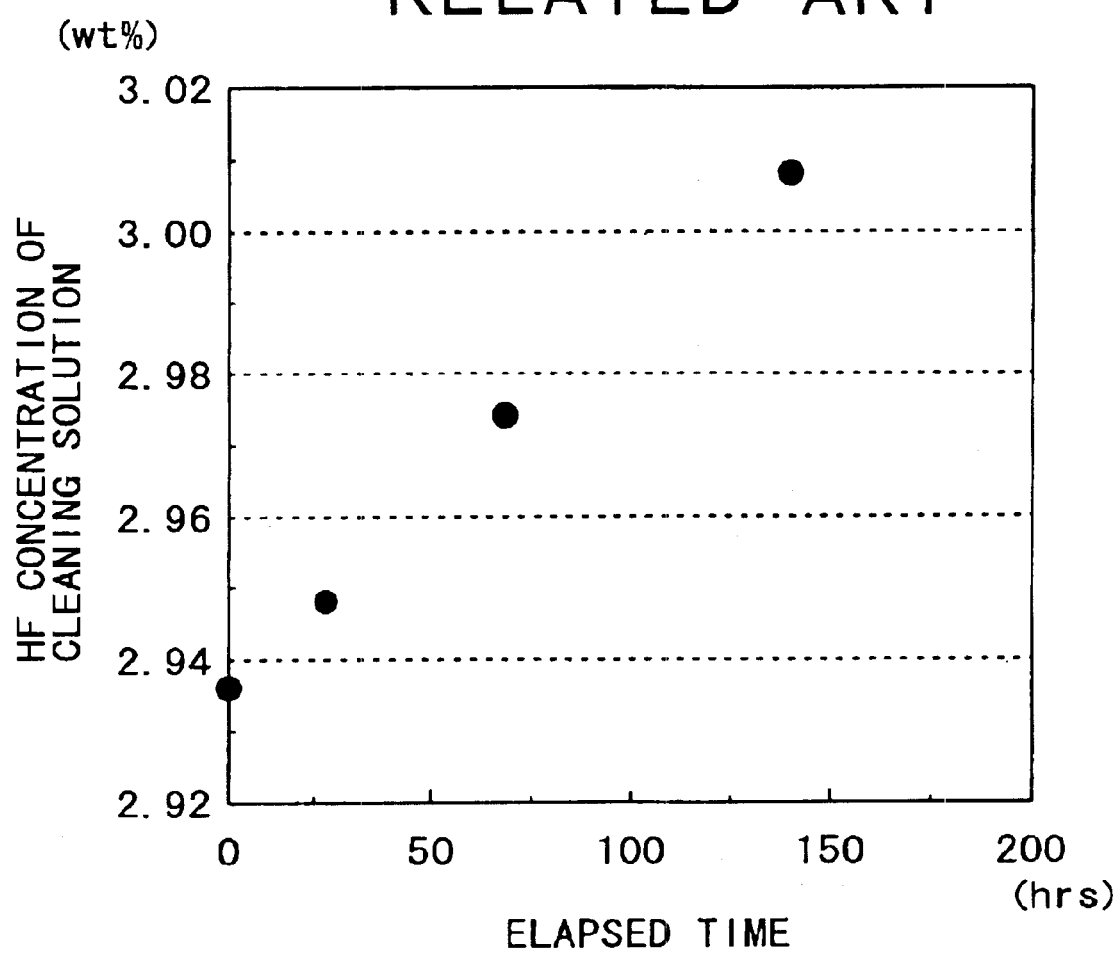
FIG. 1 is a graphical representation of the relation between the elapsed time since it started to use a cleaning solution for a cleaning process and the HF (hydrofluoric acid) concentration of the cleaning solution in accordance with the problems with a cleaning method in the related art.
Figure 2:
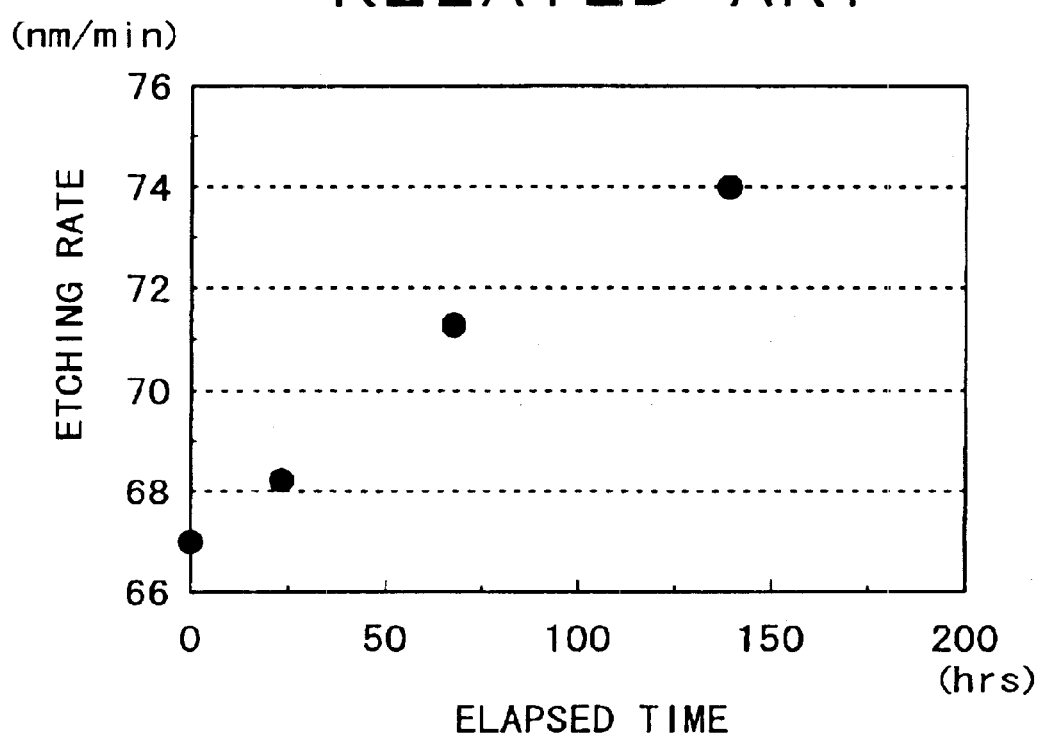
FIG. 2 is a graphical representation of the relation between the lapse of cleaning time and the etching rate of a semiconductor substrate when the cleaning solution described in FIG. 2 is used.
Figure 3:
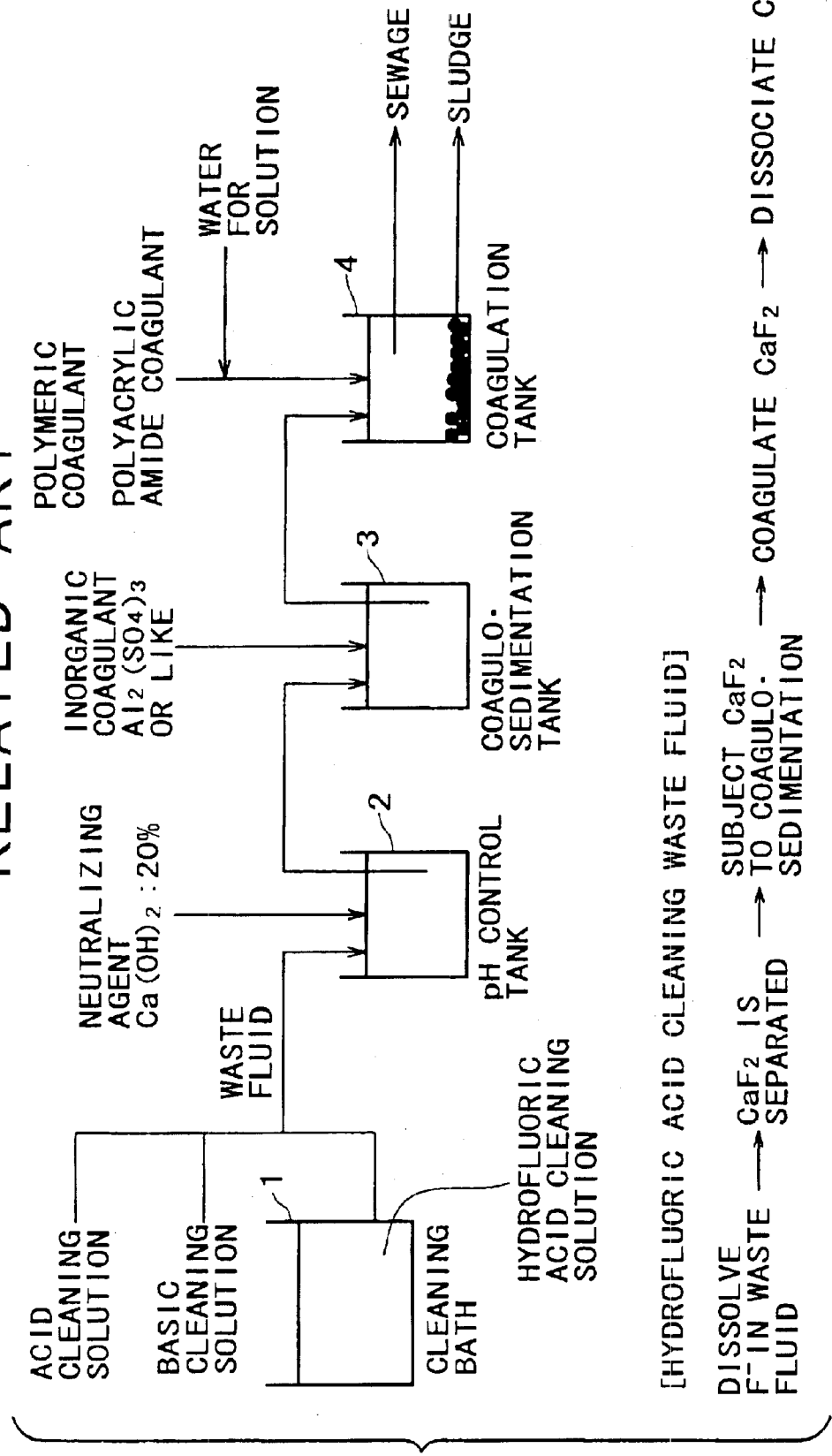
FIG. 3 is a flow sheet showing a process of the waste fluid treatment for the used cleaning solution, that is, the treatment of aluminum fluoride waste fluid released from a semiconductor manufacture process in accordance with the problems with the cleaning method in the related art.
Figure 4:
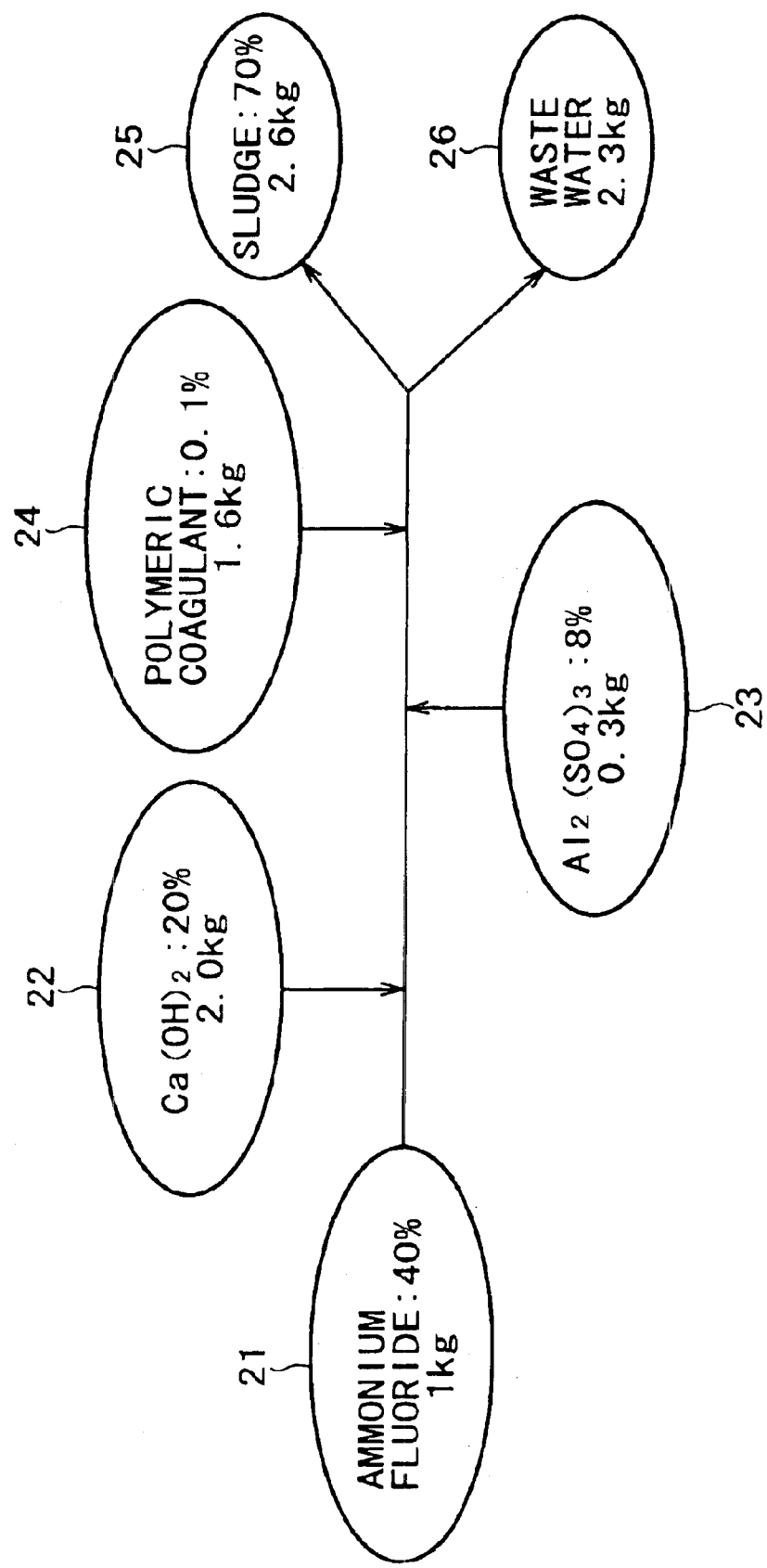
FIG. 4 is a schematic illustration of a material balance relating to the process of the waste fluid treatment in FIG. 3.
Figure 5:
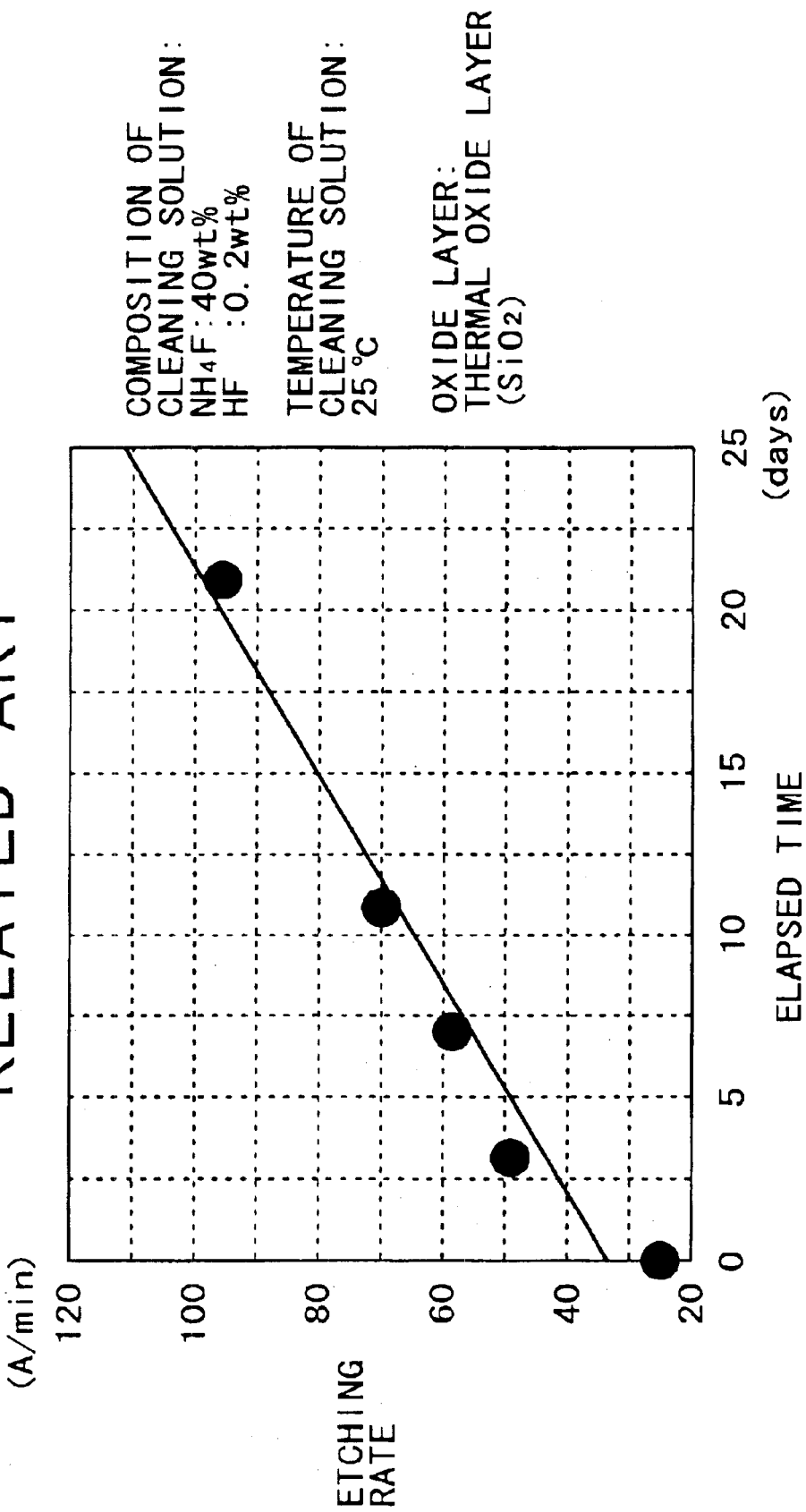
FIG. 5 is a graphical representation of the relation between the elapsed time (cleaning time) since it started to use a cleaning solution for a cleaning process and the etching rate of a silicon oxide on the surface of a semiconductor substrate in accordance with the problems with the cleaning method in the related art.
Figure 6:
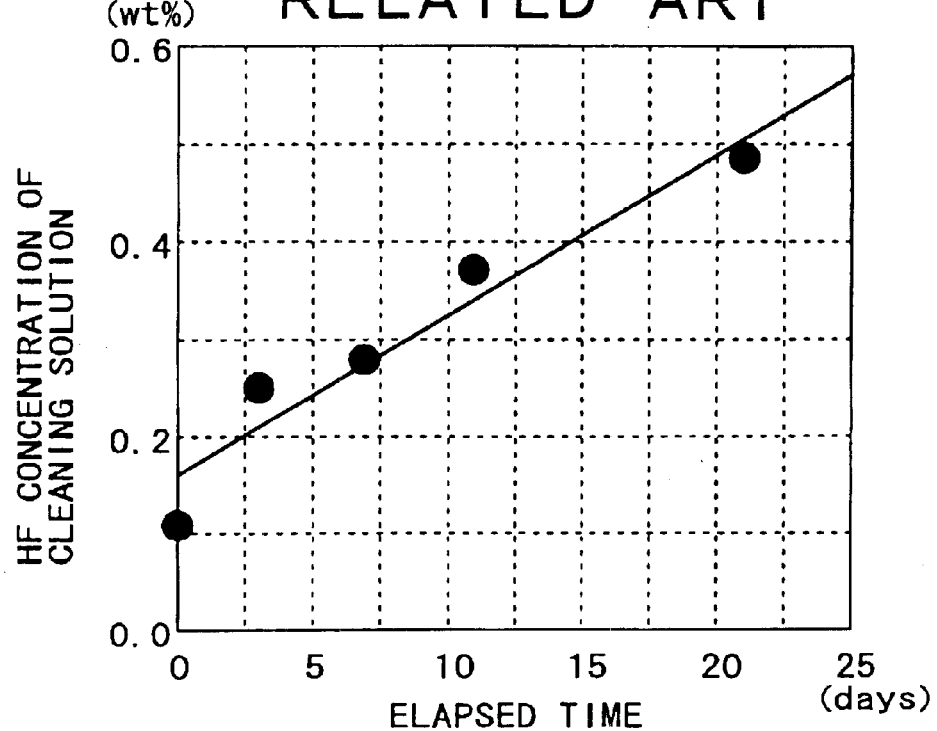
FIG. 6 is a graphical representation of the relation between the elapsed time since it started to use a cleaning solution for a cleaning process and the HF concentration of a cleaning solution when the cleaning solution described in FIG. 5 is used.
Figure 7:
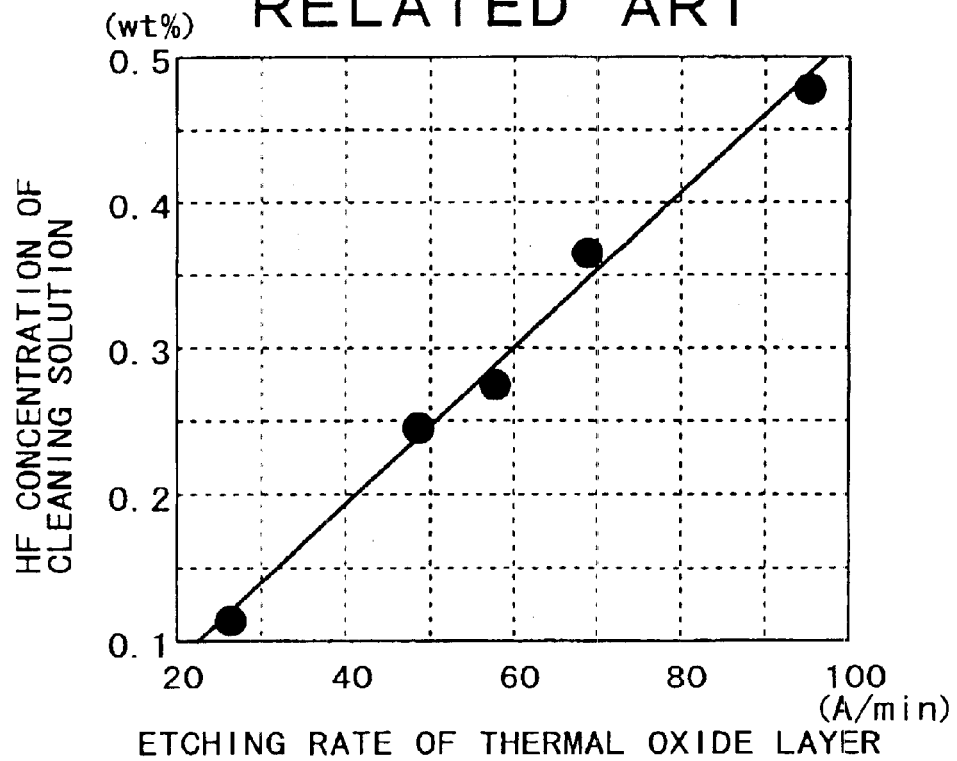
FIG. 7 is a graphical representation of the relation between the HF concentration of a cleaning solution and the etching rate of a silicon oxide on the surface of a semiconductor substrate when the cleaning solution described in FIG. 6 is used.
Figure 8:
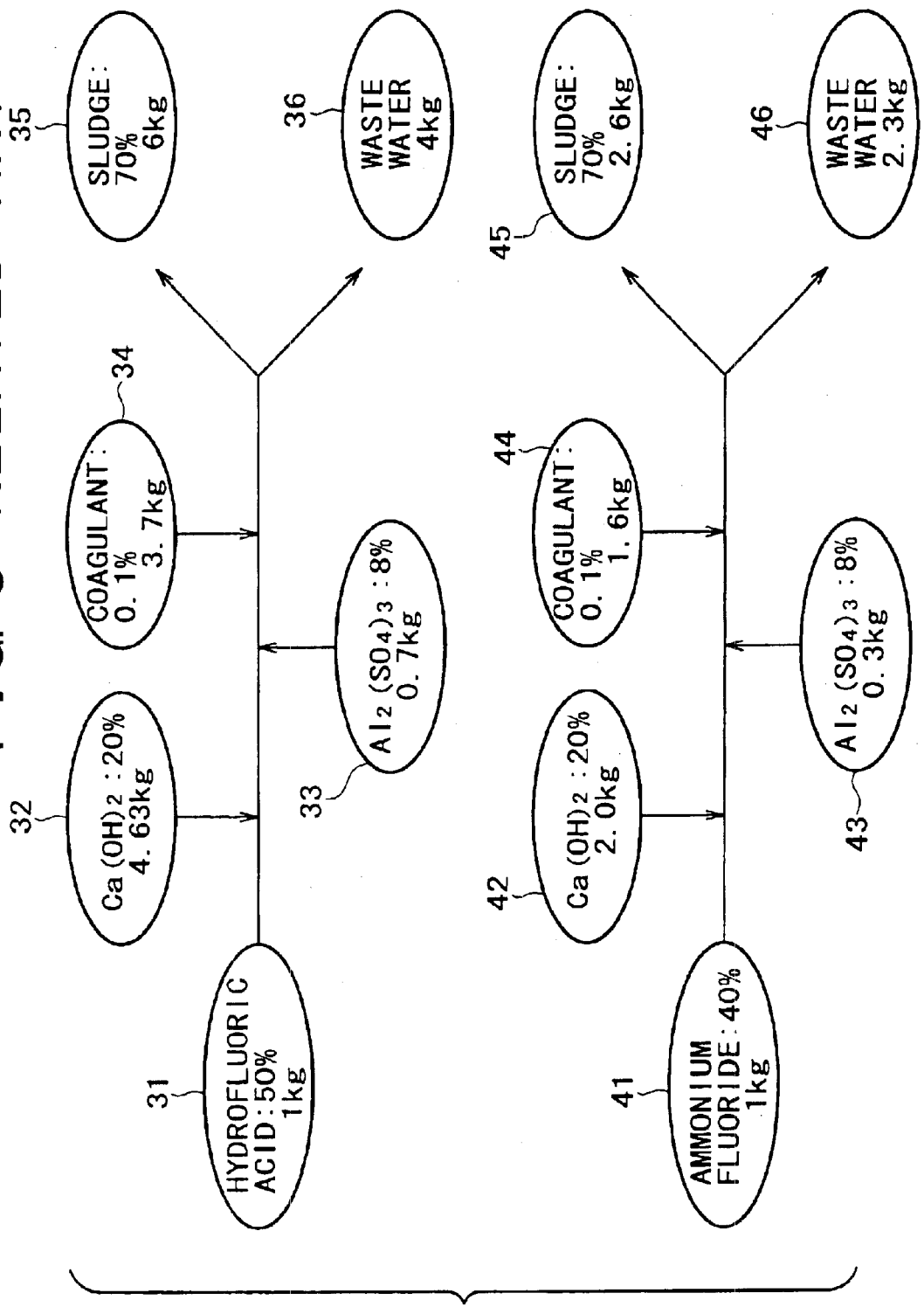
FIG. 8 is a schematic illustration of a material balance relating to the process of the waste fluid treatment.

According to the cleaning method of the present embodiment, since the fixed linear relation is observed between the elapsed time since the cleaning process is started and the etching rate as shown in FIG. 10, the etching rate (a value of a vertical axis when the elapsed time is given by 0 in FIG. 2) at the starting time of the cleaning process is determined depending on the HF (hydrofluoric acid) concentration of the cleaning solution at the starting time of the cleaning process, while the etching rate after start of the cleaning process is automatically determined depending on the elapsed time since the cleaning process was started.

Accordingly, the HF concentration of the cleaning solution at the starting time of the cleaning process and the elapsed time since the cleaning process is started are required to estimate the etching rate simply. The above cleaning method further has an effect on highly reproducible cleaning enough to permit cleaning at a uniform and constant etching rate. On the other hand, the required etching time (the above elapsed time since the cleaning process is started) is simply obtained by setting the required etching rate. Furthermore, the required etching time or the HF concentration of the required cleaning solution may be obtained more simply by formulating the above linear relation into a numerical expression.

Incidentally, in Japanese Patent Laid-open No. 9-22891 (relating to the invention titled "Apparatus and method for wet-cleaning process"), there is disclosed an apparatus for etching and cleaning an oxide from the surface of a silicon wafer. In the apparatus, a cleaning bath stored with a chemical solution is installed under the atmosphere limited in temperature, humidity and clean air flow rate for cleaning wafers while allowing clean air limited in relative humidity to 70% or more to flow horizontally toward an upper part of the level of the chemical solution in the cleaning bath.

However, according to the above apparatus, the clean air, when being allowed to continuously flow, is blown vertically against the wafer surface also for the duration of the operation of pulling up the wafer cassette from the cleaning bath after cleaning for transport to the next cleaning bath, for instance, resulting in a turbulent flow of clean air on the wafer surface. Thus, adhesion of so-called particles (foreign matters) to the cleaned wafer surface occurs. To eliminate this drawback, there is a need for troublesome operations of stopping the supply of clean air every transport of the wafer cassette.

On the other hand, the cleaning method and apparatus according to an embodiment of the present invention are characterized by cleaning the substrates while supplying the clean air from the part above the cleaning bath toward the level of the cleaning solution downwards vertically. Thus, since the clean air flows in parallel to the surface of each wafer at the time of transport of the wafer cassette, there is little fear of occurrence of particles. Accordingly, the wafer cassette may be transported with the clean air kept flowing.

Using the wet-cleaning method of the present embodiment permits the cleaning process to be made uniform enough to provide cleaned products of high quality stably, and also may decrease the frequency in replacement of the cleaning solution. In consequence, a burden on the waste fluid treatment may be lightened thanks to the decrease in amount of released waste fluid of the used cleaning solution with the decreasing amount of chemicals consumed for preparing the cleaning solution. In addition, the resource saving is attained with the decreasing amount of chemicals consumed for the waste fluid treatment, resulting in the substantial decrease in amount of sludge and waste water released from the waste fluid treatment.

According to the wet-cleaning method of an embodiment of the present invention, since the cleaning process has an increased effect of decreasing the evaporation loss water from the cleaning solution, and besides, the evaporation loss of water is controlled within the predetermined range, the linear relation is provided stably between the time required for cleaning and the concentration of the active components in the cleaning solution, providing more increased effects of an embodiment of the present invention.

According to the wet-cleaning method of an embodiment of the present invention, since the solution prepared by dissolving at least one of ammonium fluoride and hydrofluoric acid in water is used as the cleaning solution for cleaning in such a way that the silicon oxide layer is removed from the surface of the silicon substrate by etching, the cleaning process is made uniform enough to provide the linear relation between the cleaning time and the etching rate, permitting a highly reproducible cleaning process, together with highly accurate control of the etching rate.

The wet-cleaning apparatus according to an embodiment of the present invention may carry the cleaning method according to an embodiment of the present invention into operation accurately, or more accurately and efficiently, or more accurately and stably.

A description will now be given of the method and apparatus for cleaning the substrate according to embodiments of the present invention in detail with reference to the accompanying drawings.

The present invention is directed to the process of cleaning (or etching) the substrate with an aqueous solution of ammonium fluoride or ammonium fluoride hydrofluoric acid mixture as a cleaning solution, and more specifically, to the process of cleaning the substrate with a cleaning solution of a fixed concentration at all times through the process of replenishing the cleaning solution with a required component such as water, ammonium, aqueous ammonium, an aqueous solution of ammonium fluoride depending on the change in concentration of various components in the cleaning solution for correction of the changed concentration, while replacing the cleaning solution depending on the cumulative amount of time the cleaning solution was used.

FIG. 11 is a graphical representation of the relation between the lapse of time and the etching rate to a thermal oxide as to the ammonium fluoride hydrofluoric acid mixture solution. The composition ratio of $NH_4F$ (40 wt. %) to HF (50 wt. %) in the cleaning solution is 400/1, the temperature of the cleaning solution is limited to 25° C., and the thermal oxide layer is $SiO_2$.

It is ascertained from FIG. 11 that the etching rate to the thermal oxide substantially increases with the lapse of time.

Although the etching rate changes every moment in the process of cleaning the substrate with the above cleaning solution, there is a considerably high correlation (a proportional relation) between the etching rate and the elapsed time. This means that the water content or the chemical components ($NH_4F$, HF) in the cleaning solution change (evaporate) with the lapse of time, more specifically, the HF (a direct component causing etching of the thermal oxide) concentration of the cleaning solution increases at a fixed rate by reason of evaporation of the water or the ammonium component from the cleaning solution at a fixed rate.

FIG. 12 is a graphical representation of the change in HF concentration of the cleaning solution with the lapse of time, and it is ascertained from FIG. 12 that the HF concentration increases at a fixed rate with the lapse of time.

Accordingly, it is considered that the process of cleaning (etching) the substrates with the aqueous solution of ammonium fluoride or ammonium fluoride hydrofluoric acid mixture needs to maintain the HF concentration of the cleaning solution stably and uniformly.

Figure 13:
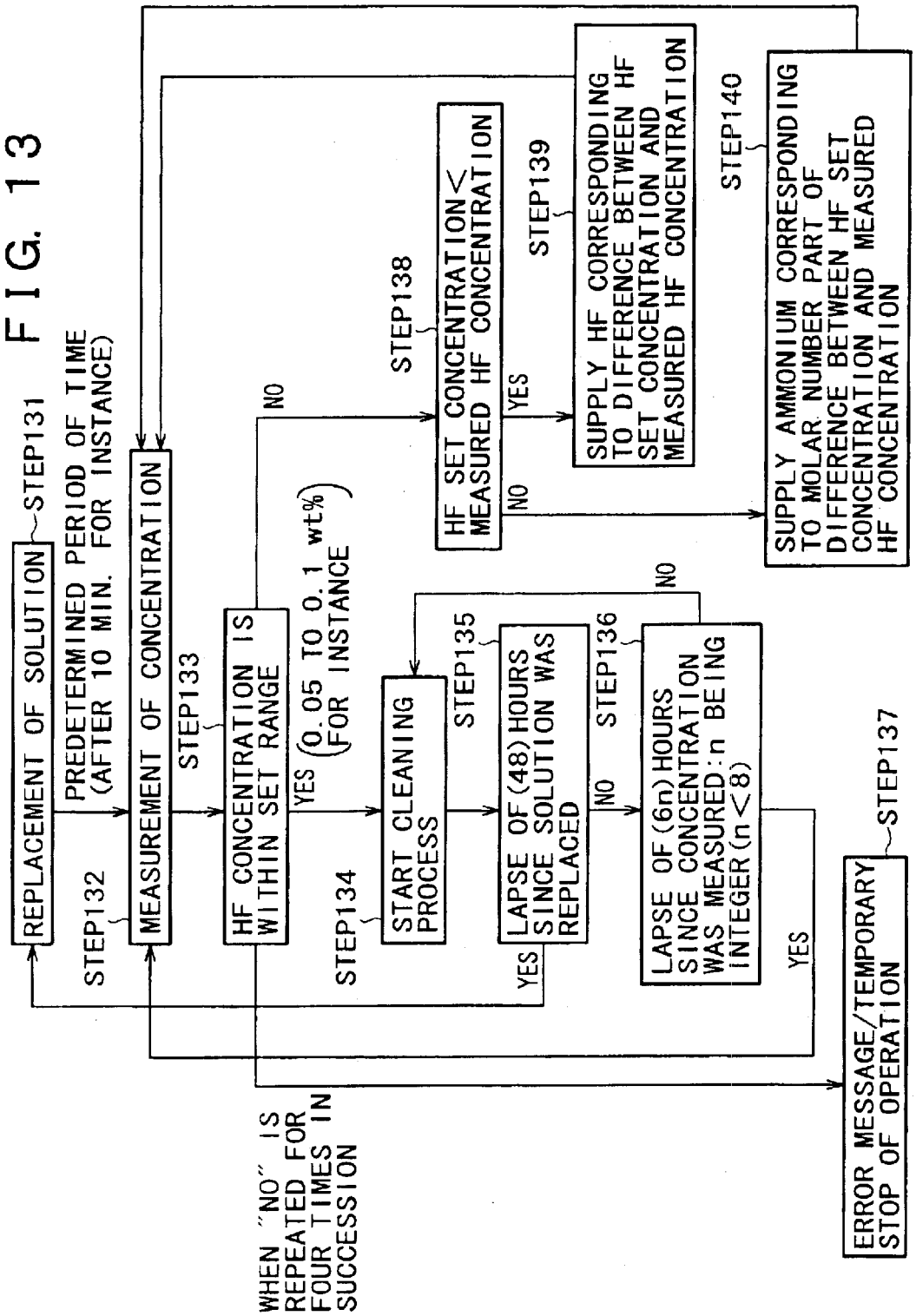
FIG. 13 is a flow chart showing the process flow of a cleaning system according to the present invention.

In this connection, according to an embodiment of the present invention, there is provided a cleaning system as shown in FIG. 13 to maintain the HF concentration of the cleaning solution at a value within a predetermined range.

In the cleaning system, the concentration of the cleaning solution is measured regularly for the subsequent operations on the basis of the result of measurement.

A description will now be given of the cleaning system applied to the case of measuring the HF concentration as a target concentration for measurement.

As shown in FIG. 13, in the cleaning system of the present embodiment, the HF concentration is measured regularly (every 6×n time, for instance; n being an integer less than 8) with a concentration measuring unit since the HF concentration gradually changes with the lapse of time as described above (Step 132).

According to the cleaning system, measurement on the component concentration (HF, for instance) in the cleaning solution may be executed by employing a method such as measuring absorbance of light with a predetermined wavelength, infrared/ultraviolet absorption spectrum, refractive index, specific gravity, light transmittance and conductivity or the like or using a measuring unit such as a Karl Fischer's titration meter and a liquid (ion) chromatography or the like.

If the HF concentration lies within the predetermined range, that is, the range of 0.05 to 0.1 wt. % as the result of measurement on the concentration, the cleaning process is started (Steps 133, 134).

Then, the whole cleaning solution in the cleaning bath is replaced after having been used for a predetermined period of time up to the solution replacement time (Step 135). In this cleaning system, the solution replacement time is set every lapse of 48 hours (Step 131).

When the replacement of cleaning solution is performed, the concentration of the replaced solution is measured at a predetermined period of time, that is, 10 minutes after the completion of the replacement of cleaning solution.

The cleaning system continues cleaning until the solution replacement time is reached, while counting the elapsed time since the concentration was measured. Then, the HF concentration is ascertained through re-measurement on the concentration after the lapse of a predetermined period of time (every 6×n hours, for instance; n being an integer less than 8) (Step 136).

Incidentally, in the above flow, it does not make any difference which is ascertained earlier, the solution replacement time or the elapsed time since the concentration was measured.

On the other hand, when the HF concentration is out of the predetermined range, that is, the range of 0.05 to 0.1 wt. %, for instance, as the result of measurement on the concentration, the cleaning solution is replenished with a component for correcting the HF concentration (Step 138).

If the measured HF concentration exceeds the predetermined range described above, for instance, the cleaning solution is replenished with the ammonium component to lower the HF concentration (Step 139).

In this step, supplying the ammonium component corresponding to the molar number of a difference between the set HF concentration and the measured HF concentration permits the HF concentration to be restored to a value within the above predetermined range.

Specifically, the cleaning solution is replenished with ammonium gas or aqueous ammonium containing the ammonium component in an amount given by the expression of [Measured HF concentration (wt. %)−set HF concentration (wt. %)]×(ammonium molecular weight/HF molecular weight)×total weight of cleaning solution.

Replenishing with the ammonium component causes the neutralization of HF to provide ammonium fluoride, and as a result, the HF concentration in the cleaning solution is controlled. Replenishing with aqueous ammonium may provide the effects on both dilution and neutralization.

On the other hand, when the measured HF concentration is lower than the predetermined range, the cleaning solution is replenished with the HF component to raise the HF concentration.

In this step, supplying the HF component corresponding to a difference between the set HF concentration and the measured HF concentration permits the HF concentration to be restored to a value within the above predetermined range.

Specifically, the cleaning solution is replenished with the HF component such as HF gas and hydrofluoric acid in an amount given by the expression of [Measured HF concentration (wt. %)−set HF concentration (wt. %)]×total weight of cleaning solution.

Incidentally, in the cleaning system, an error message is issued to temporarily discontinue the operation, if the HF concentration is not brought within the predetermined range in spite of several times of the measurement on concentration. Specifically, the cleaning system issues the error message to temporarily discontinue the operation, if the HF concentration was not brought within the predetermined range four times in succession, for instance (Step 137).

Replenishing with the component for correction of the HF concentration if being out of the predetermined range as the result of regular measurement on the HF concentration makes the etching process with the cleaning solution uniform and stable (that is, maintains the etching rate to the oxide constant), eliminating the need for frequent replacement of the cleaning solution like the related art. Thus, the life of the cleaning solution may be extended, permitting a contribution toward not only the decrease (resource saving) in cleaning solution consumption with the decreasing frequency in solution replacement but also the decrease (resource saving) in waste water treatment agents for the waste water treatment for the cleaning solution. A contribution toward the decrease in amount of sludge and waste water released from the waste water treatment (the decrease in released waste amount) with the decreasing amount of chemicals consumed is also possible.

Thus, it may be said that the embodiment of the present invention permits the substrate cleaning process to be made uniform and stable, but also may contribute toward the preservation of the global environment inclusive of the resource saving and the decrease in released waste amount or the like.

As described above, using the method and apparatus of the present embodiment permits the process of cleaning the substrate with the aqueous solution of ammonium fluoride to be made uniform and stable and also may decrease the frequency in replacement of the cleaning solution, permitting not only the resource saving of chemicals (the cleaning solution and the waste water treatment agent) but also the substantial decrease in released sludge and waste water amounts with the decreasing amount of chemicals consumed.

A description will now be given of embodiments of the present invention with reference to the accompanying drawings.

Figure 14:
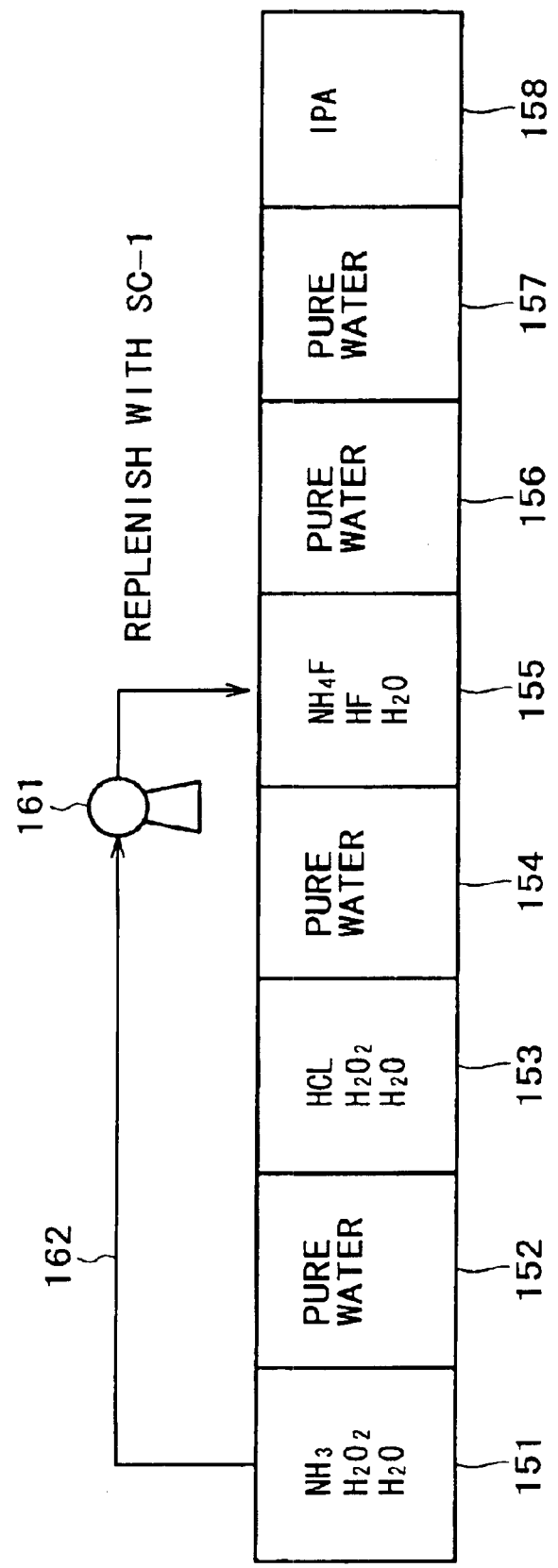
FIGS. 14 to 18 are schematic illustrations of a structure of a wet-cleaning apparatus according to embodiments of the present invention, together with a substrate cleaning method carried into operation using this wet-cleaning apparatus, respectively.

FIG. 14 is a schematic illustration of a structure of a wet-cleaning apparatus according to one embodiment of the present invention, together with a substrate cleaning method carried into operation using this wet-cleaning apparatus. The cleaning apparatus has a SC-1 bath 151, a rinsing bath 152, a SC-2 bath 153, a rinsing bath 154, a BHF bath 155, a rinsing bath 156, a rinsing bath 157 and a drying bath 158, which are arranged in this order side by side.

A cleaning solution prepared by dissolving ammonium and aqueous hydrogen peroxide ($H_2O_2$) in water is stored in the SC-1 bath 151, while a cleaning solution prepared by dissolving hydrochloride acid and aqueous hydrogen peroxide ($H_2O_2$) in water is stored in the SC-2 bath 153. Incidentally, the above ammonium is dissolved in the form of ammonium hydrate ($NH_4OH$). A cleaning solution (normally having the HF concentration of about 0.1 wt. % and the $NH_4F$ concentration of about 40 wt. %) prepared by dissolving ammonium fluoride ($NH_4F$) and hydrofluoric acid (HF) in water is stored in the BHF bath 155, while pure water (ion-exchange water) is stored in each of the rinsing baths 152, 154, 156 and 157. The drying bath 158, which may be for drying speedily the surface of the substrate by blowing heated clean air thereagainst for exhalation of IPA (isopropyl alcohol) after spraying steam of IPA toward the surface of the rinsed substrate, is used.

A description will now be given of a structure of an automatic diluent supply unit for restoring the HF concentration to a value set earlier than the rise of HF concentration by diluting the cleaning solution in the BHF bath 155 with a predetermined amount of cleaning solution intermittently supplied from the SC-1 bath 151 depending on the amount of cleaning solution in the BHF bath 155 and the rise of HF concentration. That is, the SC-1 bath 151 and the BHF bath 155 are connected together through piping 22 provided with a pump 161. The discharge side of the pump 161 of the piping 162 is provided with an electromagnetic valve and an integrating flow meter, which are connected together. The BHF bath 155 is provided with a cleaning solution level gauge and an HF concentration measuring unit for measuring the HF concentration of the automatically sampled cleaning solution. There is also provided an automatic control unit for automatically opening the electromagnetic valve for a predetermined period of time. Further, the level gauge and the HF concentration measuring unit are connected to the automatic control unit.

A cassette transport mechanism for vertically or horizontally transporting the wafer cassette is provided as extending from a part above the SC-1 bath 151 to a part above the drying bath 158. Further, the whole wet-cleaning apparatus is installed in a chamber partitioned with a wall as desired in such a way as to supply the clean air from the part above the SC-1 bath 151 while exhausting air from the part above the drying bath 158.

A description will now be given of one embodiment of a silicon substrate cleaning method carried into operation using the above substrate cleaning apparatus. A number of silicon substrates (silicon wafers) are loaded in a wafer cassette in such a way that the substrates are placed vertically in parallel to each other at proper spaces. The cassette is supported with the transport mechanism and is then lowered into the SC-1 bath 151 to immerse the silicon substrates inclusive of the cassette in the cleaning solution for cleaning. The silicon substrates in the cleaning process are cleaned in such a way that the thermal oxide or native oxide layer is removed from the surface of each silicon substrate by etching. After the cleaning process, the cassette is pulled up by the transport mechanism for transport to a portion right above the rinsing bath 152. Then, the cassette is lowered into the rinsing bath to immerse the silicon substrates inclusive of the cassette in pure water for rinsing. Thereafter, the similar procedure is required to clean and rinse the silicon substrates in the SC-2 bath 153 and the rinsing baths 154 to 157, and finally, the rinsed silicon substrates are dried in the drying bath 158.

In the cleaning apparatus, a predetermined amount of cleaning solution (with no content of HF) in the SC-1 bath 151 is intermittently supplied into the BHF bath 155 to dilute the HF concentration of the cleaning solution in the BHF bath 155 with water in SC-1 solution for the purpose of restraining the HF concentration of the cleaning solution in the BHF bath 155 from rising with the lapse of cleaning time so as to maintain the HF concentration substantially constant to provide the etching rate maintained substantially constant. The intermittent supply of diluent is carried out according to the following procedure. Incidentally, the pump 161 is kept operative for the duration of the substrate cleaning process.

The level of the cleaning solution in the BHF bath 155 is measured intermittently with the level gauge at intervals of a predetermined period of time, and the measured value is transmitted to the automatic control unit. In synchronization with the level measurement, the HF concentration of the cleaning solution is measured with the HF concentration measuring unit, and this measured value is also transmitted to the automatic control unit. In the automatic control unit, the amount of cleaning solution in the BHF bath 155 is calculated on the basis of the measured level value, and the required amount of diluent supplied is calculated on the basis of the calculated amount of cleaning solution and the measured HF concentration value. Then, the electromagnetic valve is opened in response to a signal from the automatic control unit to start the supply of diluent. When the fact that the required amount of diluent supplied is reached is measured with the integrating flowmeter, a signal representing the above fact is transmitted to the automatic control unit. The automatic control unit then closes the electromagnetic valve on the basis of this transmitting signal, thereby terminating one cycle of intermittent supply of diluent. Thereafter, the intermittent supply of diluent is repeated according to the similar procedure.

In the cleaning method and apparatus according to an embodiment of the present invention, diluents available for diluting the HF concentration include aqueous solutions of ammonium aqueous hydrogen peroxide mixture (SC-1: the mixed aqueous solution), hydrochloric acid aqueous hydrogen peroxide mixture (SC-2), sulfuric acid aqueous hydrogen peroxide mixture, phosphoric acid, sulfuric acid nitric acid mixture, fuming nitric acid and acetic acid, ion exchange water and hydrophilic organic solvents [alcohol [isopropyl alcohol, ethyl alcohol, methyl alcohol,], acetone, dimethyl sulfoxide (DMSO), N-methylpyrrolidene (NMP), dioxane, and dimethylformamide (DMF)]. These diluents may be used individually or as a mixture of appropriately selected diluents.

Among the above diluents, the aqueous solution of ammonium aqueous hydrogen peroxide mixture (SC-1), ion exchange water and alcohol are suitable for the diluent. When SC-1 is supplied, the above ammonium component has effects of converting the HF component in the target cleaning solution for supply of SC-1 into $NH_4F$ and also diluting the HF component with water and aqueous hydrogen peroxide in the diluent. As described above, SC-1 is supposed to be a diluent having a high effect on dilution of the HF concentration.

Further, the above diluent may be a virgin product or a recycled product once used for the other object. From the viewpoint of the resource saving, the latter is preferable. The supply of diluent may be carried out concurrently with the operation of replenishing with ammonium fluoride, hydrofluoric acid, ammonium, water and a surfactant or the like as the components of the target cleaning solution for dilution of the HF concentration.

Figure 15:
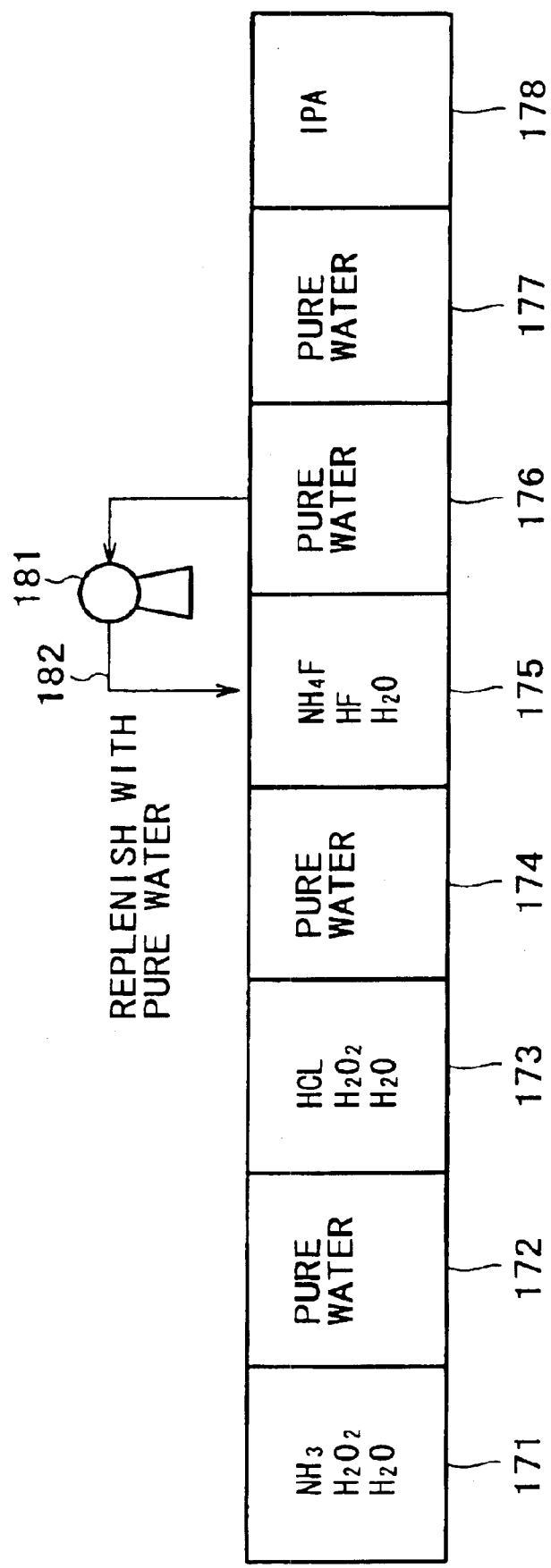

A description will now be given of a structure of a wet-cleaning apparatus according to another embodiment, together with a substrate cleaning method carried into operation using this wet-cleaning apparatus with reference to FIG. 15. This wet-cleaning apparatus is similar in structure to that shown in FIG. 14, except that a rinsing bath 172 and a BHF bath 175 are connected together through piping 182 provided with a pump 181 to dilute the HF concentration of the cleaning solution in the BHF bath 175 with pure water (ion exchange water) in the rinsing bath 176.

Figure 16:
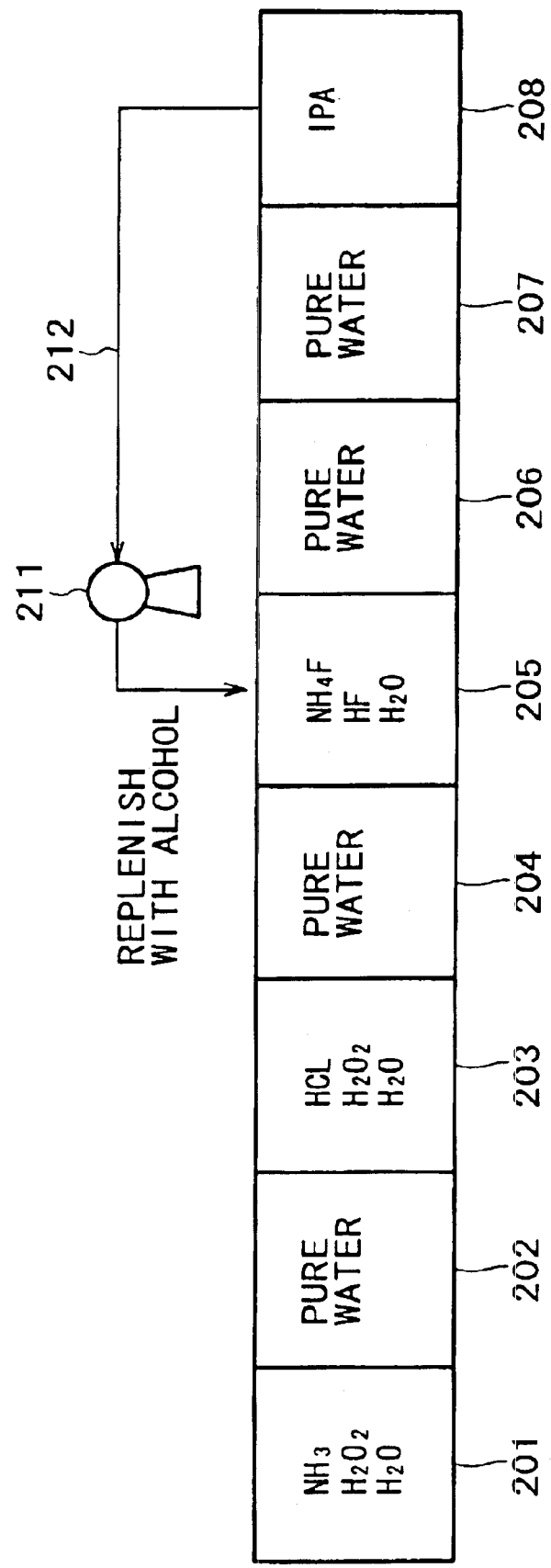

A description will now be given of a structure of a wet-cleaning apparatus according to a further embodiment, together with a substrate cleaning method carried into operation using this wet-cleaning apparatus with reference to FIG. 16. This wet-cleaning apparatus is similar in structure to that shown in FIG. 14, except that a drying bath 208 and a BHF bath 205 are connected together through piping 212 provided with a pump 201. In this case, an IPA supply pipe installed at the drying bath 208 is connected to the piping 212. According to this cleaning apparatus, the rise of HF concentration of the cleaning solution is corrected with liquid IPA supplied into the BHF bath 205.

Figure 17:
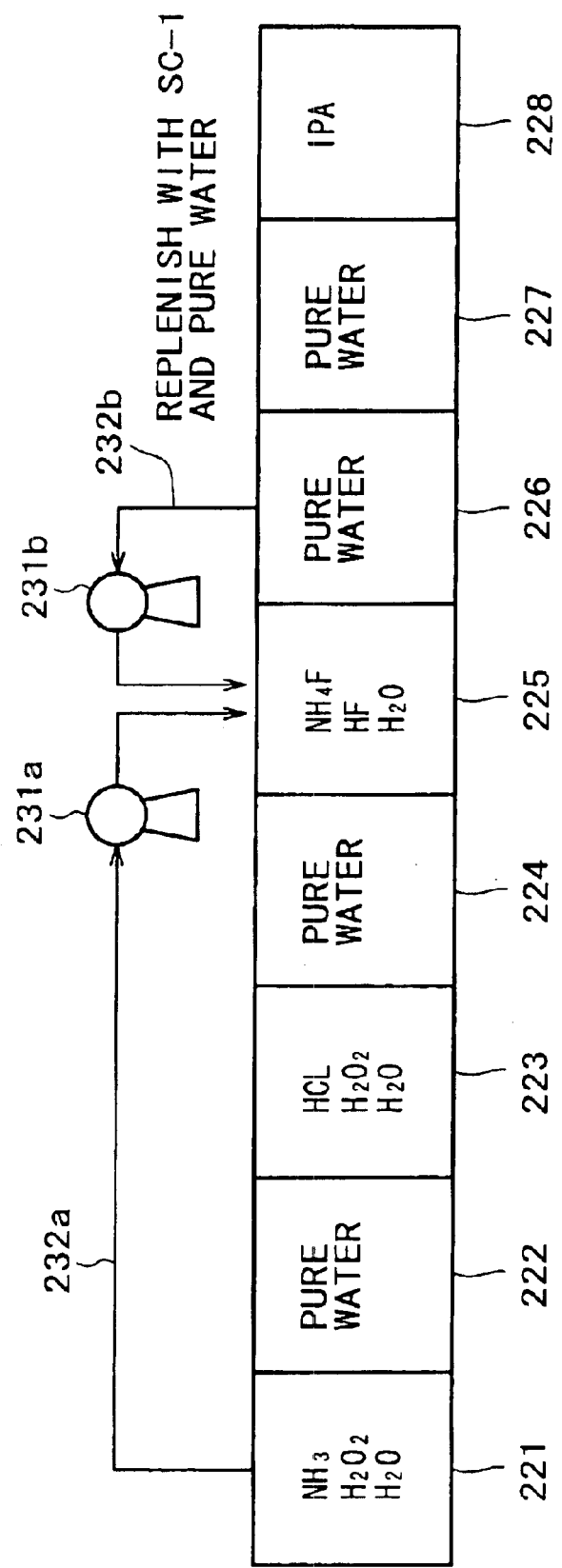

A description will now be given of a structure of a wet-cleaning apparatus according to a still further embodiment, together with a substrate cleaning method carried into operation using this wet-cleaning apparatus with reference to FIG. 17. This cleaning apparatus is similar in structure to that shown in FIG. 14, except that a SC-1 bath 221 and a BHF bath 225 are connected together through piping 232a provided with a pump 231a, and a rinsing bath 226 and the BHF bath 225 are connected together through piping 232b provided with a pump 231b. According to this cleaning apparatus, the HF concentration of the cleaning solution in the BHF bath 225 is diluted with water in the SC-1 bath 221 and pure water in the rinsing bath 226.

A description will now be given of a structure of a wet-cleaning apparatus according to a yet further embodiment, together with a substrate cleaning method carried into operation using this wet-cleaning apparatus with reference to FIG. 18. This cleaning apparatus is quite different from those shown in FIGS. 14 to 17 in structure and operation. That is, in use of two cleaning apparatuses of different systems, a cleaning solution (with no content of HF) of one cleaning apparatus 240 and liquid IPA are supplied into a cleaning solution in the other cleaning apparatus 250 to correct the rise of HF concentration so as to maintain the HF concentration substantially constant.

Specifically, the cleaning apparatus 240 has a SC-1 bath 241, a rinsing bath 242, a SC-2 bath 243, a rinsing bath 244, a DHF bath 245, a rinsing bath 246, a rinsing bath 247 and a drying bath 248, which are arranged in this order in a string. The cleaning apparatus 250 has a NH$_4$F bath 251, a BHF bath 252, a DHF bath 253, rinsing baths 254, 255 and a drying bath (a spin drier) 256, which are arranged in this order in a string. The SC-1 bath 241 of the cleaning apparatus 240 is connected to the NH$_4$F bath through piping 258a provided with a pump 257a, and the drying bath 248 of the cleaning apparatus 240 is connected to the DHF bath 253 through piping 258b provided with a pump 257b. The spin drier 256, which may be for spinning the substrate at high speed to shake off condensed IPA by centrifugal force after the IPA steam is sprayed against the substrate surface on condition that the substrate having been rinsed with pure water is set as being freely spun at high speed about a vertical axis, is used.

Figure 18:
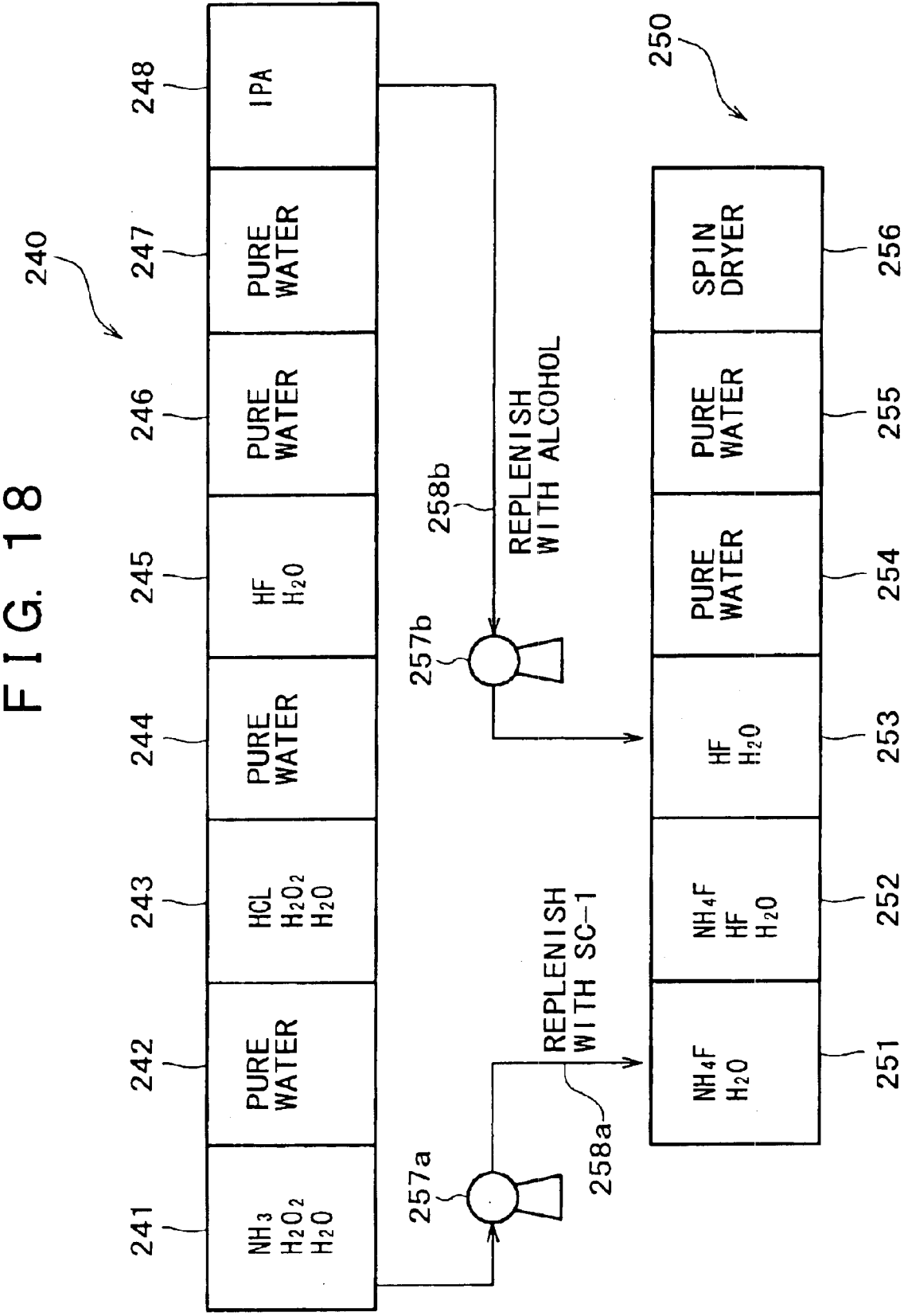

Incidentally, the supply of pure water from the rinsing tank (242, for instance) of the cleaning apparatus 240 into the NH$_4$F bath 251 and the DHF bath 253 will do, instead of the supply of SC-1 solution and liquid IPA in FIG. 18. Also, the supply of pure water from the rinsing bath 254 of the cleaning apparatus 250 is also applicable, in addition to the embodiment of FIG. 18.

Figure 19:
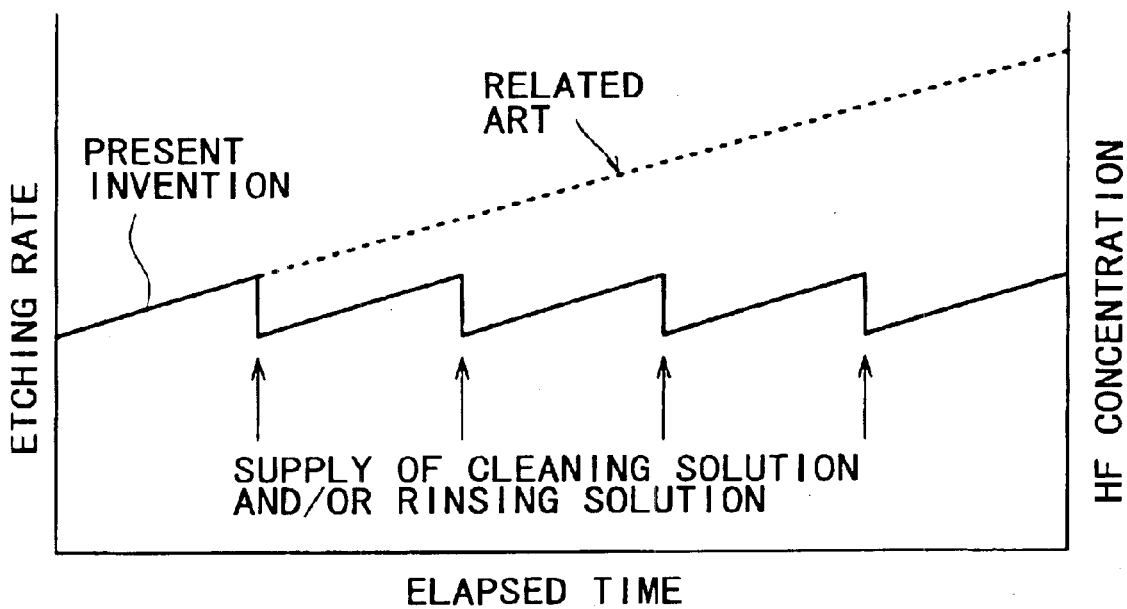
FIG. 19 is a graphical representation of the change in etching rate for a silicon oxide on the surface of a semiconductor substrate and the change in HF concentration of the cleaning solution when the cleaning method of the present invention is used, in comparison with those when the cleaning method in the related art is used.

FIG. 19 is a graphical representation of the change in silicon oxide etching rate with the lapse of time and the change in HF concentration of the cleaning solution with the lapse of time according to the results of experiments in use of the cleaning method (example) of an embodiment of the present invention, in comparison with those according to the results of experiments in use of the cleaning method in the related art. According to the example of the present embodiment, a predetermined amount of predetermined diluent was intermittently supplied by use of the cleaning apparatus of FIG. 14 to correct the rise of HF concentration of the cleaning solution in the BHF bath 155. On the other hand, according to the comparative example, cleaning was performed without the supply of diluent at all. As is apparent from FIG. 19, the etching rate and the HF concentration according to the embodiment are maintained substantially constant irrespective of a difference in the elapsed time. On the other hand, the etching rate and the HF concentration according to the comparative example are gradually increasing.

Incidentally, measurement on the concentration of active components and water in the cleaning solution may be by methods for measuring (1) absorbance of light with a predetermined wavelength, (2) infrared/ultraviolet absorption spectrum, and (3) refractive index, specific gravity, light transmittance and conductivity or the like, or using a measuring unit such as (4) a Karl Fischer's titration meter and (5) a liquid (ion) chromatography or the like.

Using the cleaning method and apparatus as described above may substantially lower the change or non-uniformity in etching rate, that is, cleaning effects with the lapse of cleaning time as to the cleaning solution prepared by dissolving at least hydrofluoric acid as an active component in water. Thus, the cleaning process with the cleaning solution may be made uniform and stable enough to provide higher yield of the semiconductor substrate and the liquid crystal display substrate, permitting the substantial decrease in amount of chemicals for the waste fluid treatment (the waste water treatment) for the cleaning solution with the decreasing frequency in replacement of the cleaning solution (the extended life of the cleaning solution). The above cleaning method and apparatus also have an effect of decreasing the amount of wastes released (that is, sludge and waste water (sewage)) with the decreasing amount of chemicals consumed.

As has been described in the foregoing, according to the wet-cleaning method and apparatus of the embodiments of the present invention, the cleaning process is made uniform enough to provide cleaned products of high quality stably, as well as higher yield of the semiconductor substrate and the liquid crystal display substrate, permitting the decrease in frequency in replacement of the cleaning solution. As a result, a burden on the waste fluid treatment may be lightened thanks to the decrease in amount of released wastes of the used cleaning solution with the decreasing amount of chemicals consumed for preparing the cleaning solution. In addition, the resource saving is attained with the decreasing amount of chemicals consumed for the waste fluid treatment, resulting in the decrease in amount of sludge and waste water released from the waste fluid treatment.

A description will now be given of a substrate cleaning method and a substrate cleaning apparatus according to a further embodiment of the present invention with reference to the accompanying drawings.

The present invention is directed to the process of cleaning (or etching) the substrate with an aqueous solution of ammonium fluoride or ammonium fluoride hydrofluoric acid mixture as a cleaning solution, and more specifically, to the process of replenishing the cleaning solution with an ammonium component depending on the cumulative amount of time the cleaning solution was used and the concentration of various components in the cleaning solution.

Figure 20:
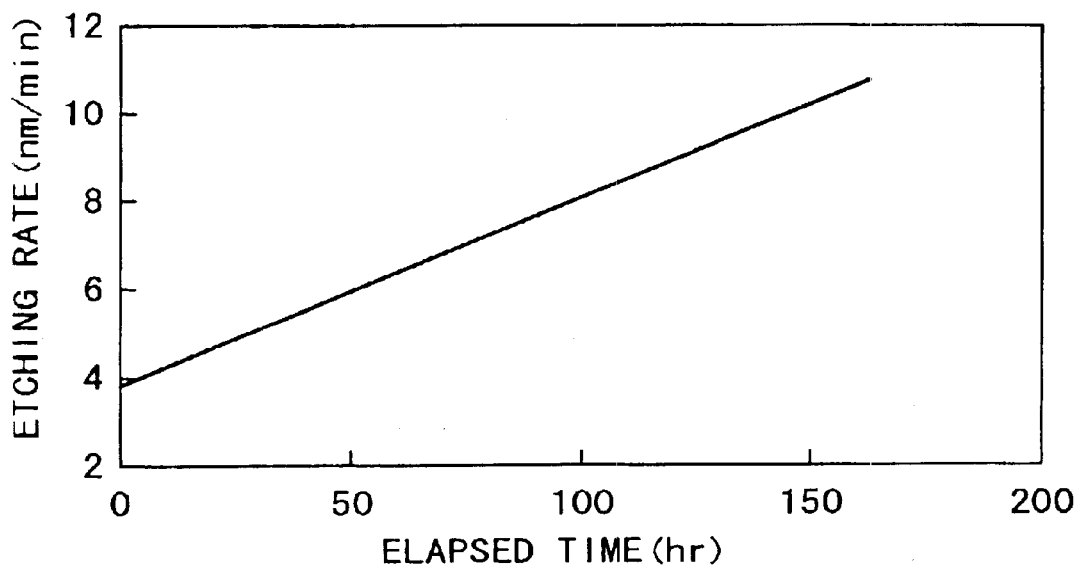
FIG. 20 is a characteristic graphical representation of the relation in a cleaning solution between the elapsed time and the etching rate.

FIG. 20 is a graphical representation of the relation between the elapsed time and the etching rate to a thermal oxide as to the ammonium fluoride hydrofluoric acid mixture solution. The composition ratio of $NH_4F$ (40 wt. %) to HF (50 wt. %) is 400/1, the temperature of the cleaning solution is limited to 25° C., and the thermal oxide layer is $SiO_2$.

It is ascertained from FIG. 20 that the etching rate to the thermal oxide substantially increases with the lapse of time.

As described above, while the etching rate changes every moment in the process of cleaning the substrate with the above cleaning solution, there is a considerably high correlation (a proportional relation) between the etching rate and the elapsed time. This means that the water content or chemical components (NH4F, HF) in the cleaning solution change (evaporate) with the lapse of time, more specifically, the concentration of the HF component (the direct component causing etching of the thermal oxide) increases at a fixed rate by reason of the evaporation of water or ammonium component from the cleaning solution at a fixed rate.

Figure 21:
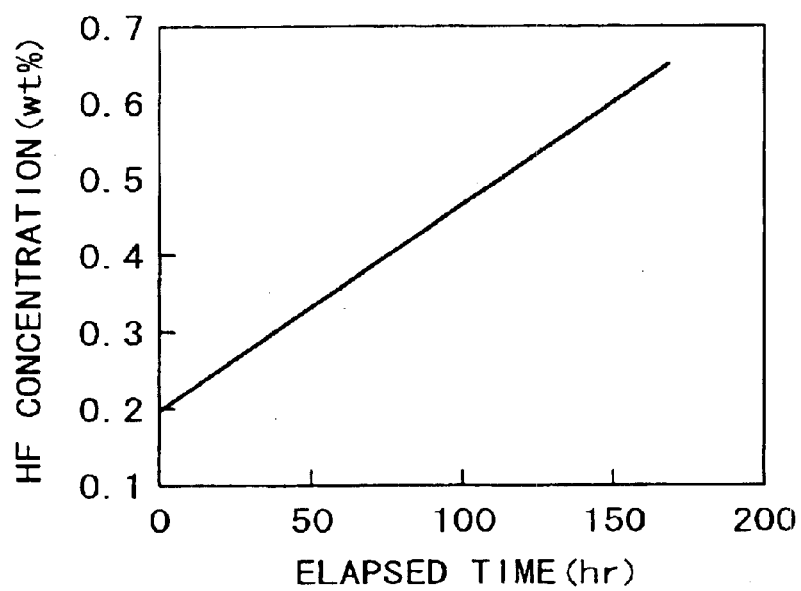
FIG. 21 is a characteristic graphical representation of the relation between the elapsed time and the HF concentration of the cleaning solution.

FIG. 21 is a graphical representation of the change in HF concentration of the cleaning solution with the lapse of time, and it is ascertained that the HF concentration increases at a fixed rate with the lapse of time.

In this embodiment, how the ratio of $NH_4F$ to HF [$NH_4F$ (wt. %)/HF(wt. %)] changes with the lapse of time was examined using the aqueous solution of ammonium fluoride hydrofluoric acid mixture. The results are shown in FIG. 22.

Figure 22:
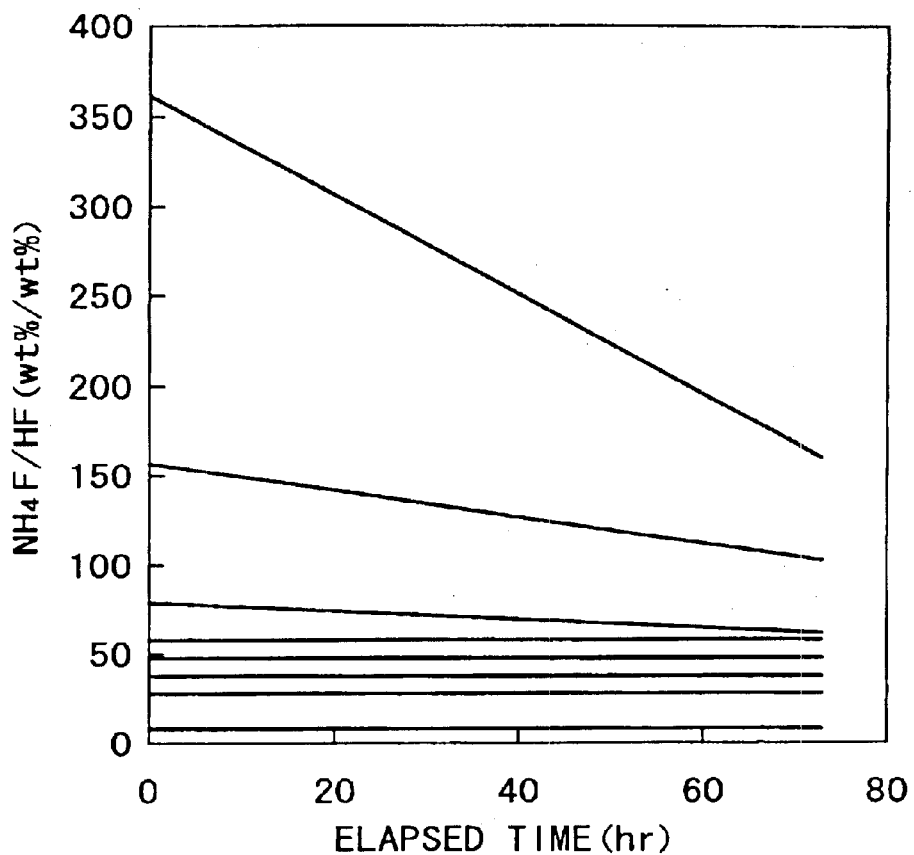
FIG. 22 is a characteristic graphical representation of the change in $NH_4F$-to-HF ratio depending on the lapse of time.

It is ascertained from FIG. 22 that the component change with the lapse of time varies depending on the ratio of ammonium fluoride to hydrogen fluoride.

Specifically, when the composition ratio of ammonium fluoride (wt. %) to hydrogen fluoride (wt. %) is not more than 50 ($\leq 50$), the change in composition ratio with the lapse of time hardly occurs. On the other hand, when the composition ratio of ammonium fluoride (wt. %) to hydrogen fluoride (wt. %) is more than 50 (>50), the change in composition ratio with the lapse of time occurs (lowers). This is because the cleaning solution containing a large percentage of ammonium fluoride is easily affected by the evaporation of ammonium component as shown by the expression of $NH_4F \rightarrow NH_3 \uparrow + HF$. (It is a matter of course that evaporation of water occurs in this case as well.)

As described above, it may be said that the means of replenishing the cleaning solution with the ammonium component at any time has an effect of maintaining the cleaning effects (the etching rate) constant when the composition ratio of ammonium fluoride (wt. %) to hydrogenfluoride (wt. %) is larger than 50 (>50) in the process of cleaning (etching) the substrate with the ammonium fluoride hydrofluoric acid mixture solution.

That is, replenishing with the ammonium component with the lapse of time may correct the rise of HF concentration enough to maintain the etching rate constant.

As a result, using this cleaning method may provide higher yield of the semiconductor substrate and the liquid crystal substrate and also may decrease the frequency in solution replacement, permitting the decrease in released sludge and waste water amounts with the decreasing amount of chemicals consumed, such as the cleaning solution and the waste water treatment agent.

Incidentally, the ammonium component to be replenished may be gaseous or liquid. Also useful is aqueous ammonium diluted with water (pure water) at a desired concentration or solutions of hydrophilic solvents (acetone and various kinds of alcohol or the like) solvable with ammonium component, or a mixture with ammonium fluoride.

Incidentally, evaporation of water content, in addition to the ammonium component, from the cleaning solution occurs. For that reason, replenishing with a proper amount of water (pure water), in addition to the ammonium component, will be also enough to maintain exactly the same composition as that at the initial time of cleaning. Incidentally, since the etching rate to each oxide is less affected by water content (whereas being largely affected by the HF concentration), replenishing with only the ammonium component is no matter. However, in this case, while the HF concentration of the cleaning solution is maintained constant by means of replenishing with the ammonium component, the $NH_4F$ concentration is gradually increasing with the lapse of time due to the evaporation of water content.

A description will now be given of a substrate cleaning apparatus according to a further embodiment of the present invention.

Figure 23:
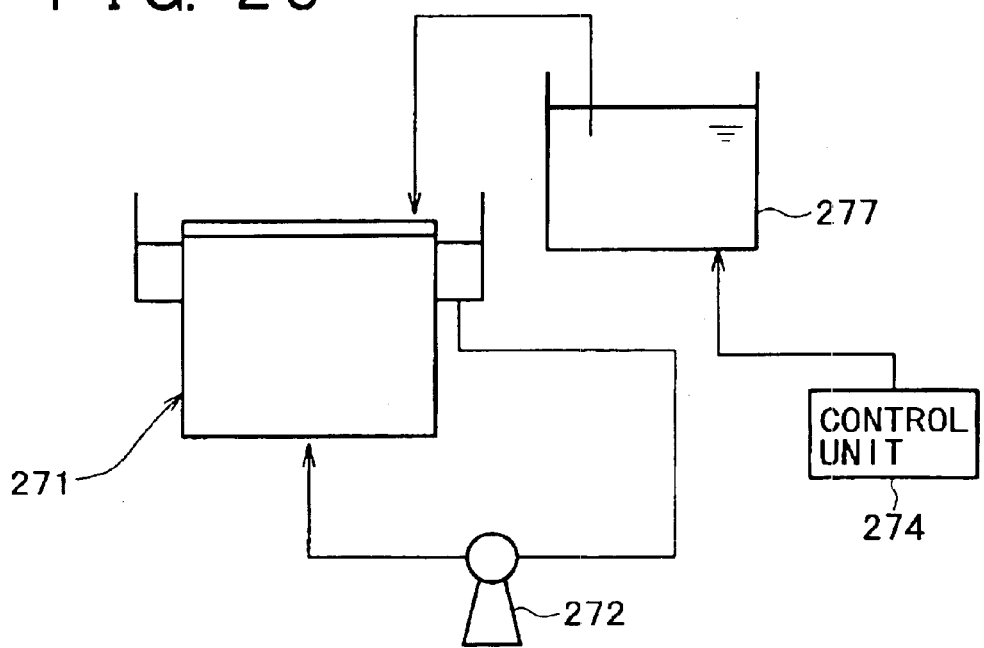
FIG. 23 is a schematic illustration of an apparatus for cleaning a substrate according to one embodiment of the present invention.

FIG. 23 is a view illustrating a substrate cleaning apparatus according to the further embodiment of the present invention.

This substrate cleaning apparatus comprises a substrate cleaning bath 271 stored with a cleaning solution such as an ammonium fluoride hydrofluoric acid mixture solution for cleaning the substrate and a circulation pump 272 for circulating the overflowing cleaning solution to the above substrate cleaning bath 271. The substrate serving as a target for cleaning is loaded in a substrate carrier, for instance, for immersing the substrate inclusive of the substrate carrier in the substrate cleaning bath 271 for cleaning (etching).

The features of the substrate cleaning apparatus are that the substrate cleaning bath 271 is provided with an aqueous ammonium reservoir tank 277 for supply of an ammonium component, and the amount of ammonium component replenished is controlled by a control unit 274.

Incidentally, ammonium component supply means available other than the above includes a continuous flow pump and means of gravity dropping, forcible feed with air and gas such as nitrogen and so on.

As described above, the etching rate to the thermal oxide substantially increases with the increasing HF component in the cleaning solution with the lapse of time at a fixed rate.

In this connection, according to the substrate cleaning apparatus, the aqueous ammonium is supplied from the aqueous ammonium reservoir tank 277 to the substrate cleaning bath 271 with the control unit 274 with the lapse of time to maintain the HF component rate constant enough to provide the etching rate maintained substantially constant.

The optimum conditions on the amount of ammonium component replenished and the replenishing timing may be set up by acquiring data as shown in FIGS. 20, 21 and 22 for calculation of the HF component increasing with the lapse of time.

Incidentally, it is preferable that the cleaning solution is replenished with the ammonium component in an amount corresponding to the evaporation loss till a desired period of time enough to maintain the cleaning solution at the (initial) concentration provided immediately after the preparation of the cleaning solution. The amount of ammonium component added may be calculated on the basis of the concentration of the cleaning solution resulting from continuous or intermittent monitoring, for instance.

Figure 24:
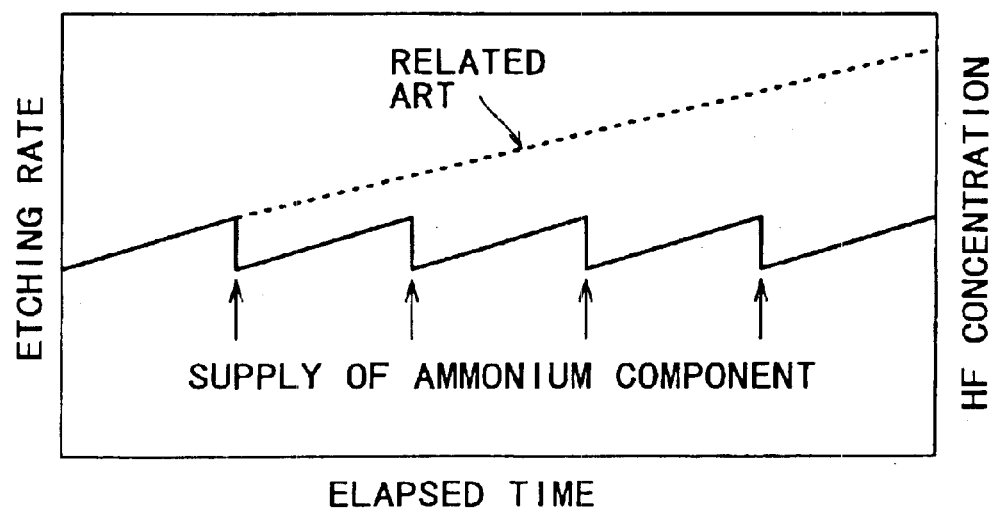
FIG. 24 is a graphical representation of the controlled state of the etching rate and the HF concentration depending on replenishment with an ammonium component.

FIG. 24 is a graphic representation of the controlled state of the etching rate and the HF concentration depending on replenishment with the ammonium component. The etching rate and the HF concentration are maintained within the fixed range by means of intermittently replenishing with the ammonium component.

Incidentally, either continuous replenishment or intermittent replenishment will be enough for the conditions of replenishment with the ammonium component. The former is more suitable to maintain the concentration constant at all times.

Figure 25:
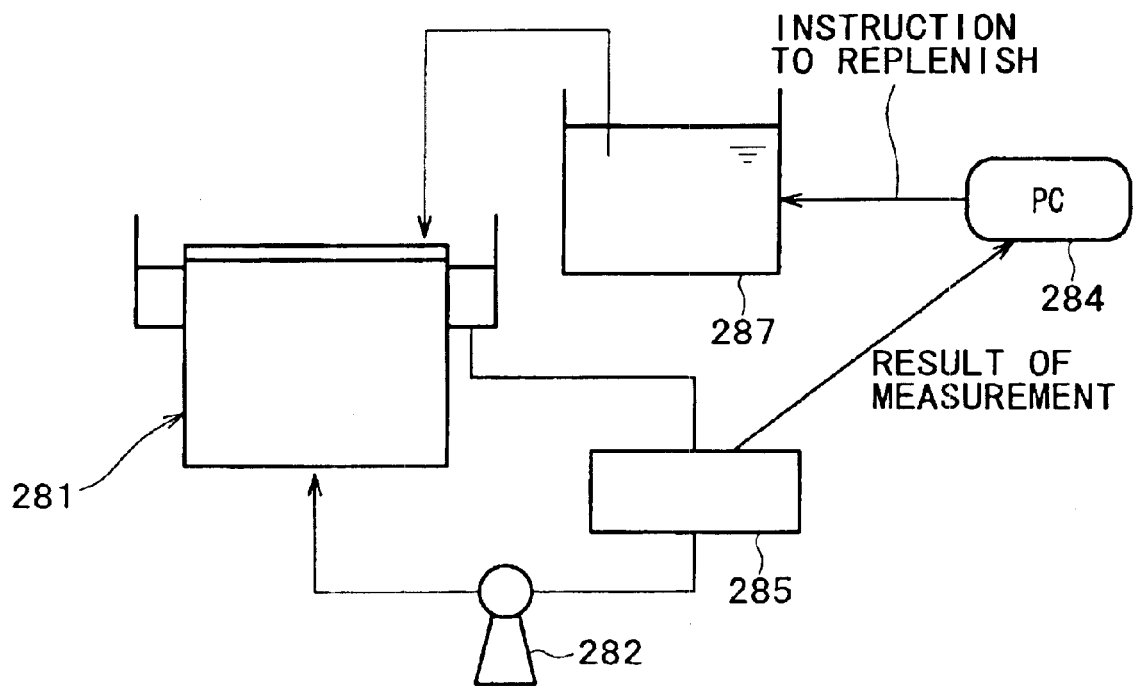
FIG. 25 is a schematic illustration of an apparatus for cleaning a substrate according to another embodiment of the present invention.

While the above substrate cleaning apparatus is configured to control the timing to replenish with the ammonium component on the basis of the measurement data, an apparatus, which is provided with a concentration measuring unit 285 as shown in FIG. 25 for measurement on the concentration of circulating cleaning solution to control replenishment with the ammonium component in real time on the basis of measured concentration information, is also applicable. The concentration measuring unit which is installed as a standing unit in the cleaning apparatus to feed back the result of measurement during the cleaning process or has the effect of reflecting the results measurement in spots to add the ammonium component under predetermined conditions without the need for being installed as the standing unit will be also used.

Specifically, control of the replenishment with the ammonium component is by the process of measuring the concentration of each component (ammonium fluoride, hydrogen fluoride and water content or the like) in the cleaning solution with the concentration measuring unit 285, then transmitting the result of measurement to a control unit 284 composed of a computer or a central monitoring board or the like for calculation of the required amount of ammonium component replenished subsequent to the judgment on the need or not of replenishment, and thereafter sending an instruction on replenishment to an aqueous ammonium feed line (the aqueous ammonium reservoir tank 287). Then, whether or not replenishment with the ammonium component was made in accordance with the instruction is ascertained by measurement with the concentration measuring unit 285.

Incidentally, measurement on the concentration of components in the cleaning solution may be by methods for measuring absorbance of light with a predetermined wavelength, infrared/ultrasonic absorption spectrum, refractive index, specific gravity, light transmittance and conductivity or the like or using a measuring unit such as a Karl Fischer's titration meter and a liquid (ion) chromatography or the like.

As described above, replenishing the cleaning solution with the ammonium component on the basis of the concentration of various components or the etching rate at each point of the cleaning process permits the etching process with the cleaning solution to be made uniform and stable (that is, maintains the etching rate constant), eliminating the need for frequent replacement of the cleaning solution like the related art. Thus, the life of the cleaning solution may be extended, permitting a contribution toward not only the decrease (resource saving) in cleaning solution consumption with the decreasing frequency in solution replacement but also the decrease (resource saving) in waste water treatment agent for the waste water treatment for the cleaning solution. A contribution toward the decrease in amount of sludge and waste water released from the waste water treatment (the decrease in released waste amount) with the decreasing amount of chemicals consumed is also possible.

As described above, the present embodiment not only permits the substrate cleaning process to be made uniform and stable but also may contribute toward the preservation of the global environment inclusive of the resource saving and the decrease in released waste amount.

As described above, using the method and apparatus of the present embodiment permits the process of cleaning the substrate with the aqueous solution of ammonium fluoride to be made uniform and stable and also may decrease the frequency in replacement of the cleaning solution, permitting the substantial decrease in released sludge and waste water amounts with the decreasing amount of chemicals consumed (the resource saving of the cleaning solution and waste treatment agents)

A description will now be given of a method and apparatus for cleaning a substrate according to the still further embodiment of the present invention with reference to the accompanying drawings.

The present invention relates the process of cleaning (or etching) the substrate with an aqueous solution of ammonium fluoride hydrofluoric acid mixture as a cleaning solution, and more specifically, to the process of replenishing the cleaning solution with water depending on the cumulative time the cleaning solution was used and the concentration of various components in the cleaning solution.

Figure 26:
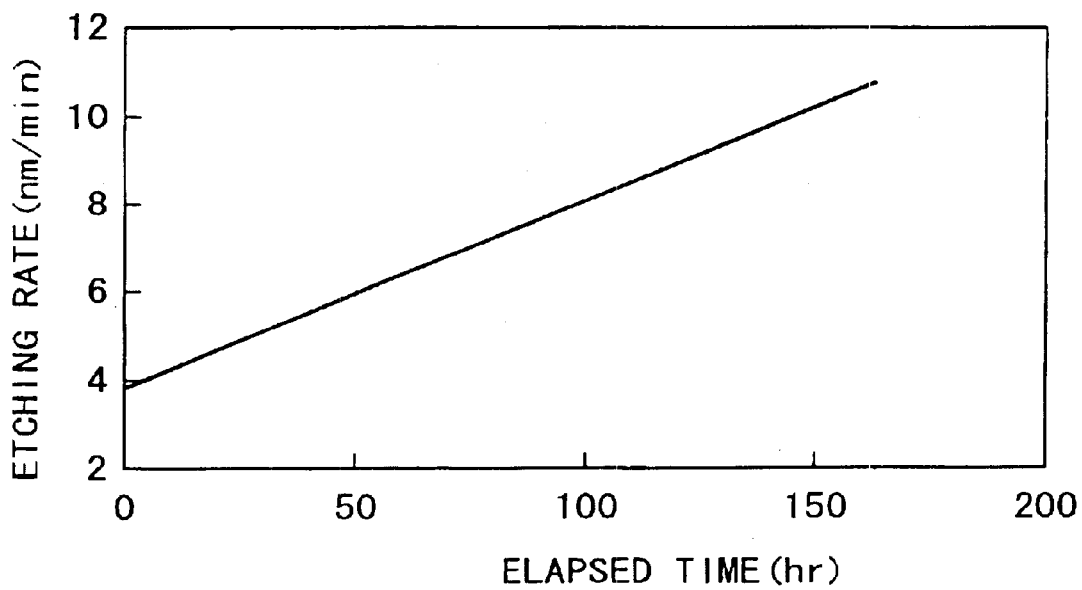
FIG. 26 is a characteristic graphical representation of the relation in a cleaning solution between the elapsed time and the etching rate.

FIG. 26 is a graphic representation of the relation between the elapsed time and the etching rate to the thermal oxide as to the ammonium fluoride hydrofluoric acid mixture solution. The composition ratio of $NH_4F$ (40 wt. %) to HF (50 wt. %) in the cleaning solution is 400/1, the temperature of the cleaning solution is limited to 25° C., and the thermal oxide layer is $SiO_2$.

It is ascertained from FIG. 26 that the etching rate to the thermal oxide substantially increases with the lapse of time.

As described above, while the etching rate changes every moment in the process of cleaning the substrate with the above cleaning solution, there is a considerably high correlation between the etching rate and the elapsed time. This means that the water content and components of chemicals ($NH_4F$, HF) in the cleaning solution change (evaporate) with the lapse of time, specifically, the concentration of the HF component (the direct component causing etching of the thermal oxide) in the cleaning solution increases at a fixed rate by reason of the evaporation of water and ammonium component from the cleaning solution.

Figure 27:
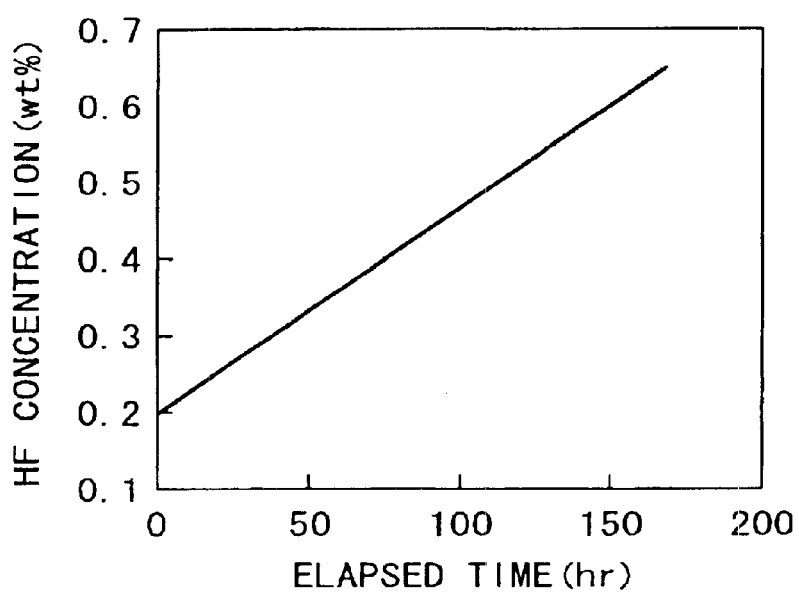
FIG. 27 is a characteristic graphical representation of the relation between the elapsed time and the HF concentration of the cleaning solution.

FIG. 27 is a graphic representation showing the change in HF concentration of the cleaning solution with the lapse of time, and it is ascertained from FIG. 27 that the HF concentration increases at a fixed rate with the lapse of time.

In this embodiment, how the ratio of $NH_4F$ to HF [$NH_4F$ (wt. %)/HF (wt. %) changes with the lapse of time is examined using the aqueous solution of ammonium fluoride hydrofluoric acid mixture. The results are shown in FIG. 28.

Figure 28:
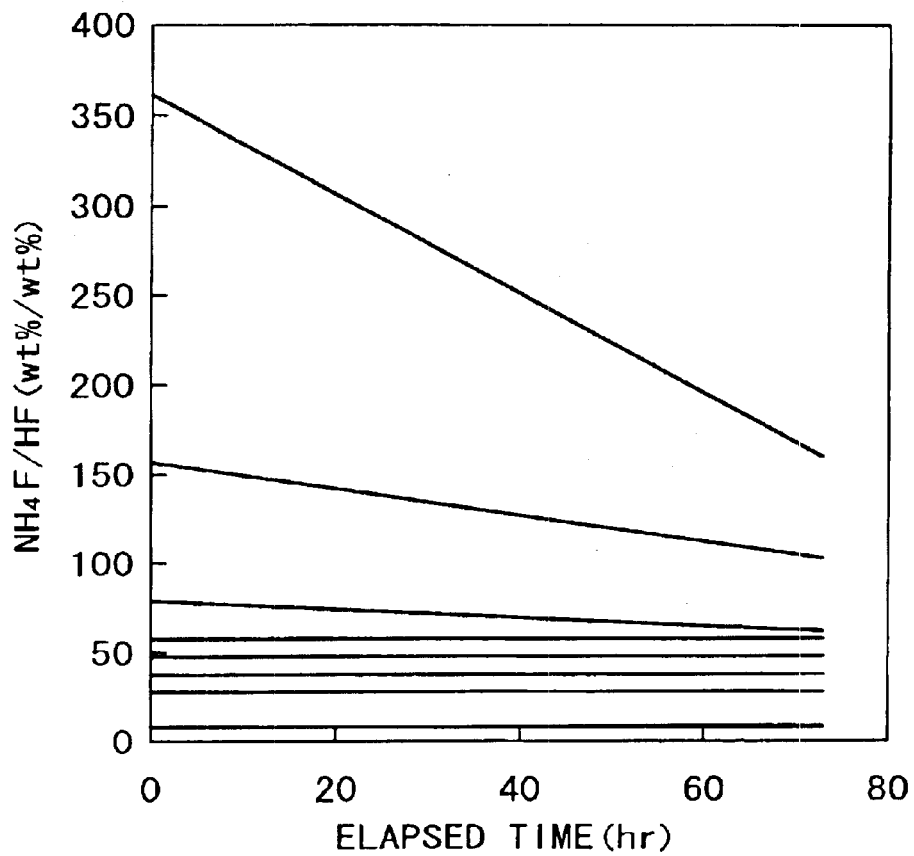
FIG. 28 is a characteristic graphical representation of the change in $NH_4F$-to-HF ratio depending on the lapse of time.

It is ascertained from FIG. 28 that the component change with the lapse of time varies depending on the ratio of ammonium fluoride to hydrogen fluoride.

Specifically, when the ratio of ammonium fluoride (wt. %) to hydrogen fluoride (wt. %) is not more than 50 ($\leqq 50$), the change in composition ratio with the lapse of time hardly occurs. On the other hand, when the ratio of ammonium fluoride (wt. %) to hydrogen fluoride (wt. %) is more than 50 (>50), the change in composition ratio with the lapse of time occurs (lowers). This is because the cleaning solution containing a high percentage of ammonium fluoride is easily affected by the evaporation of ammonium component as given by the expression of $NH_4F \rightarrow NH_3\uparrow +HF$. (It is a matter of course that evaporation of water occurs in this case as well.)

As described above, it may be said that the means of replenishing the cleaning solution with water at any time has an effect of maintaining the cleaning effects (the etching rate) constant when the ratio of ammonium fluoride (wt. %) to hydrogen fluoride (wt. %) is not more than 50 ($\leqq 50$) in the process of cleaning (etching) the substrate with the ammonium fluoride hydrofluoric acid mixture solution.

That is, replenishing with water with the lapse of time may correct the rise of HF concentration enough to maintain the etching rate constant.

As a result, using the above cleaning method may provide higher yield of the semiconductor substrate and the liquid crystal substrate or the like and also may decrease the frequency in solution replacement, permitting the decrease in released sludge and waste water amounts with the decreasing amount of chemicals consumed, such as the cleaning solution and the waste water treatment agent.

Incidentally, water to be replenished may be gaseous (steam) or liquid. Also useful is solid (ice) or a mixture with a hydrophilic solvent (acetone and various kinds of alcohol or the like) dissolvable with water (pure water) at a desired rate.

Figure 29:
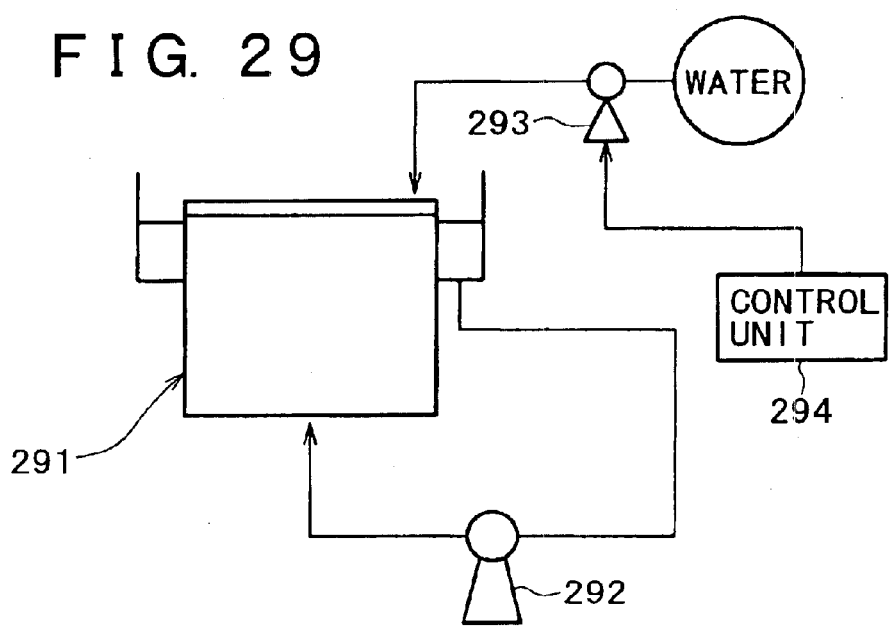
FIG. 29 is a schematic illustration of an apparatus for cleaning a substrate according to a further embodiment of the present invention.

FIG. 29 is a view illustrating a substrate cleaning apparatus according to a still further embodiment of the present invention.

This substrate cleaning apparatus comprises a substrate cleaning bath 291 stored with a cleaning solution such as an ammonium fluoride hydrofluoric acid mixture solution for cleaning the substrate and a circulation pump 292 for circulating the overflowing cleaning solution to the substrate cleaning bath 291. A substrate as a target for cleaning is loaded in a substrate carrier, for instance, to immerse the substrate inclusive of the carrier in the substrate cleaning bath 291 for cleaning (etching).

The features of the above apparatus are that the substrate cleaning bath 291 is provided with a continuous flow pump 293 for supply of water, and the amount of water replenished is controlled by a control unit 294.

Incidentally, water supply means available other than the above pump includes a means of gravity dropping, forcible feed of air and gas such as nitrogen and so on.

As described above, the etching rate to the thermal oxide substantially increases with the increasing concentration of the HF component in the cleaning solution with the lapse of time at a fixed rate.

In this connection, according to the above apparatus, water is supplied into the substrate cleaning bath 1 through the continuous flow pump 293 with the lapse of time by use of the control unit 294 to maintain the HF concentration constant enough to provide the etching rate maintained substantially constant.

Figure 30:
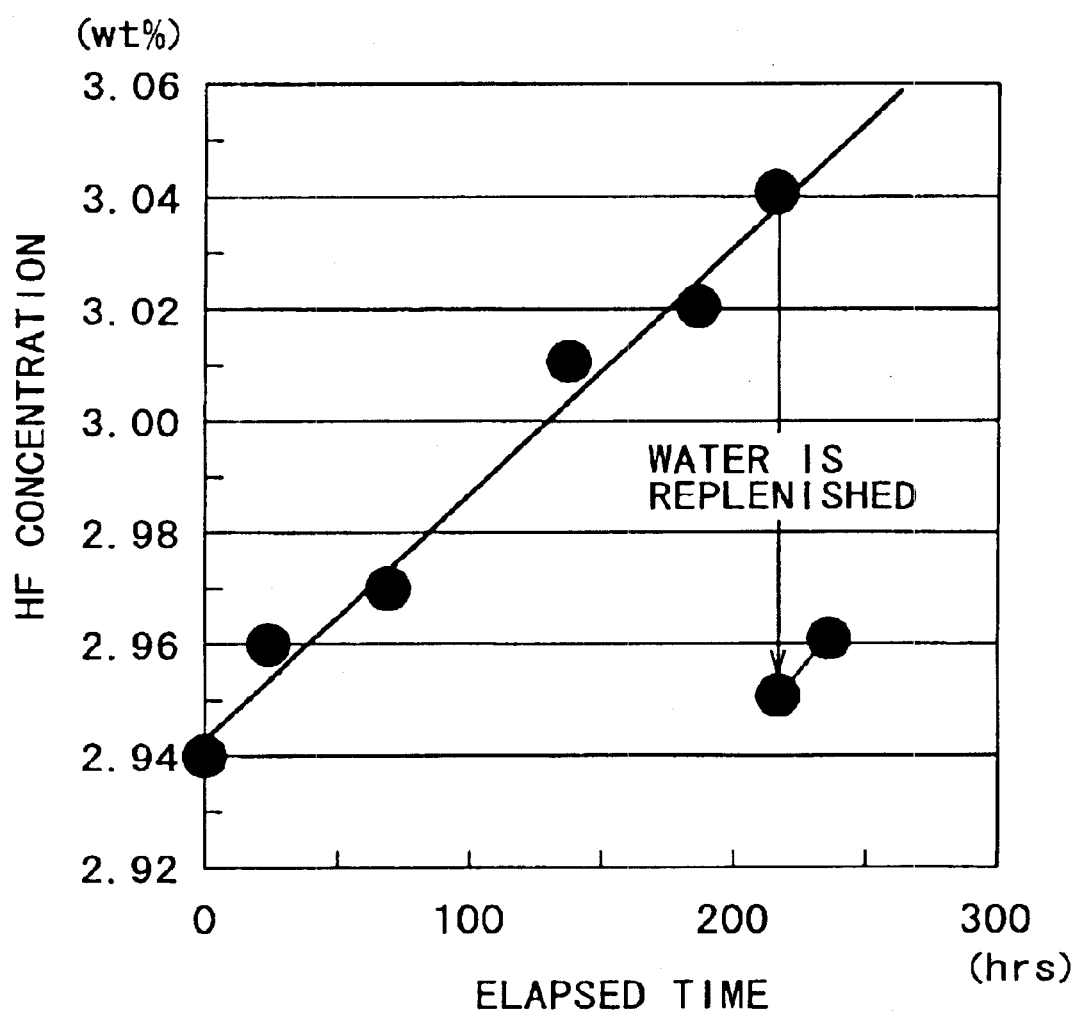
FIG. 30 is a characteristic graphical representation of the change in HF concentration depending on replenishment with water.
Figure 31:
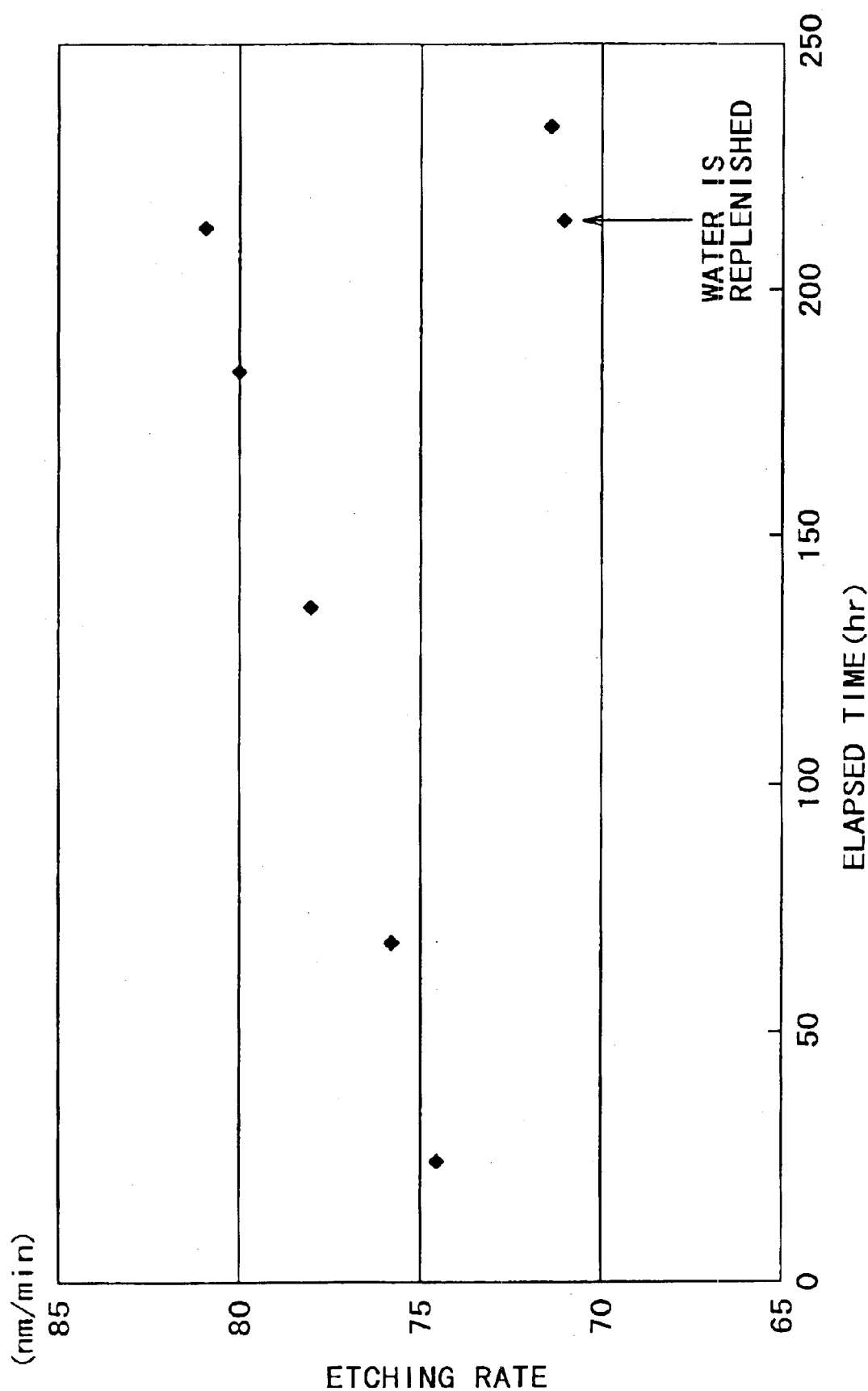
FIG. 31 is a characteristic graphical representation of the change in etching rate depending on replenishment with water.

FIG. 30 is a graphic representation of the change in HF concentration depending on replenishment with water, and it is ascertained that the HF concentration increasing with the lapse of time is restored to its initial concentration value by means of replenishing with water. Since control of the HF concentration by means of replenishing with water is related to control of the etching rate, the etching rate is also lowered by means of replenishing with water as shown in FIG. 31.

The optimum conditions on the amount of water replenished and the replenishing timing may be set up by acquiring data as shown in FIGS. 26 and 27 for calculation of the evaporation loss of water with the lapse of time.

Incidentally, it is preferable that the cleaning solution is replenished with water in an amount corresponding to the evaporation loss till a desired period of time enough to maintain the cleaning solution at the (initial) concentration provided immediately after the preparation of the cleaning solution. The amount of water added may be calculated on the basis of the concentration of the cleaning solution resulting from continuous or intermittent monitoring, for instance.

Figure 32:
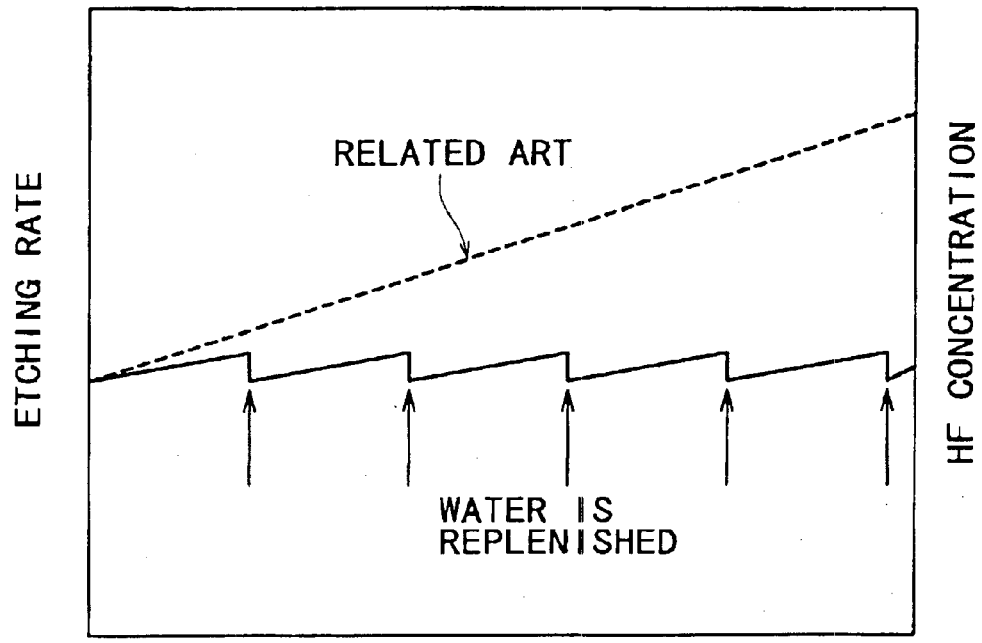
FIG. 32 is a graphical representation of the controlled state of the etching rate and the HF concentration depending on replenishment with water.

FIG. 32 is a graphic representation of the controlled state of the etching rate and the HF concentration depending on the replenishment with water. The etching rate and the HF concentration are maintained within the fixed range by means of intermittently replenishing with water.

Incidentally, either continuous replenishment or intermittent replenishment will be enough for the conditions on replenishment with water. The former is more suitable to maintain the concentration constant at all times.

Figure 33:
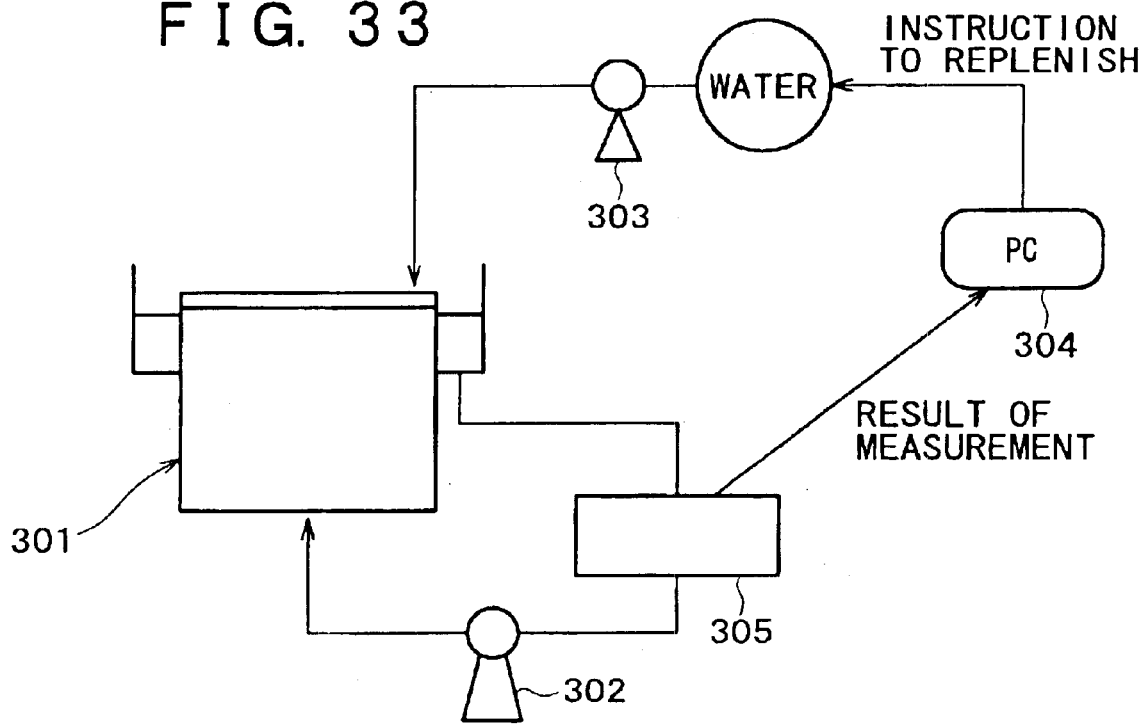
FIG. 33 is a schematic illustration of an apparatus for cleaning a substrate according to a still further embodiment of the present invention.

While the above substrate cleaning apparatus is configured to control the timing to replenish with water on the basis of the measurement data, an apparatus, which is provided with a concentration measuring unit 305 as shown in FIG. 33 for measurement on the concentration of circulating cleaning solution to control replenishment with water in real time on the basis of the measured concentration information, is also applicable. The concentration measuring unit which is installed as a standing unit in the cleaning apparatus to feedback the result of measurement during the cleaning process, or has the effect of reflecting the results measured in spots to add water under predetermined conditions without the need for being installed as the standing unit, will be also used.

Specifically, control of the replenishment with water is by the process of measuring the concentration of each component (ammonium fluoride, hydrogen fluoride and water content or the like) in the cleaning solution with the concentration measuring unit 305, then transmitting the result of measurement to a control unit 304 composed of a computer and a central monitoring board or the like for the calculation of the required amount of water replenished subsequent to the judgement on the need or not of replenishment, and thereafter, sending an instruction on replenishment to a water supply line (the continuous flow pump 303). Then, whether or not replenishment with water was made in accordance with the instruction is ascertained by measurement with the concentration measuring unit 305.

In this embodiment, measurement on the concentration of the components in the cleaning solution may be by methods for measuring absorbance of light with a predetermined wavelength, infrared/ultrasonic spectrum, refractive index, specific gravity, light transmittance and conductivity or the like or using a measuring unit such as the Karl Fischer's titration meter and the liquid (ion) chromatography or the like.

As described above, replenishing the cleaning solution with water on the basis of the etching rate and the concentration of various components at each point of the cleaning process permits the etching process with the cleaning solution to be made uniform and stable (that is, maintains the etching rate to the oxide constant), eliminating the need for frequent replacement of the cleaning solution like the related art. Accordingly, the life of the cleaning solution maybe extended, permitting a contribution toward not only the decrease (resource saving) in cleaning solution consumption with the decreasing frequency in solution replacement but also the decrease (resource saving) in waste water treatment agent for the waste water treatment for the cleaning solution. A contribution toward the decrease in amount of sludge and waste water released from the waste water treatment (the decrease in released waste amount) with the decreasing amount of chemicals consumed is also possible.

As described above, the present embodiment not only permits the substrate cleaning process to be made uniform and stable but also may contribute toward the preservation of the global environment inclusive of the resource saving and the decrease in released waste amount.

As has been described in the foregoing, using the method and apparatus of the present embodiment permits the process of cleaning the substrate with the ammonium fluoride hydrofluoric acid mixture solution to be made uniform and stable and also may decrease the frequency in replacement of the cleaning solution, permitting the substantial decrease in released sludge and waste water amounts with the decreasing amount of chemicals consumed (the resource saving of the cleaning solution and the waste water treatment agents)

Although the invention has been described in its preferred form with a certain degree of particularity, obviously many changes, variations and combinations are possible therein. It is therefore to be understood that any modifications will be practiced otherwise than as specifically described herein without departing from the scope of the present invention.

What is claimed is:

1. An apparatus for wet-cleaning a substrate, comprising:
   a plurality of cleaning baths to store solution to immerse said substrate and/or solution to spray to said substrate,
   said cleaning baths including at least a first cleaning bath and a second cleaning bath,
   said first cleaning bath storing a first solution containing an aqueous solution of ammonium fluoride and/or hydrofluoric acid,
   said second cleaning bath storing a second solution with which the rise of hydrogen fluoride concentration in the cleaning solution in said first cleaning bath can be corrected,
   piping provided between the first cleaning bath and second cleaning bath, and
   said first cleaning bath and said second cleaning bath are included in a different cleaning process line.

2. An apparatus for cleaning substrate according to claim 1, wherein said second solution is an aqueous solution of (1) ammonium with no content of fluoride, (2) pure water, or (3) alcohol.

* * * * *